US011663809B2

(12) United States Patent
Hekmatshoartabari

(10) Patent No.: US 11,663,809 B2
(45) Date of Patent: May 30, 2023

(54) THIN-FILM ACTIVE SURFACE FOR FUZZY TEMPLATE MATCHING

(71) Applicant: International Business Machines Corporation, Armonk, NY (US)

(72) Inventor: Bahman Hekmatshoartabari, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 488 days.

(21) Appl. No.: 16/881,505

(22) Filed: May 22, 2020

(65) Prior Publication Data

US 2021/0365819 A1    Nov. 25, 2021

(51) Int. Cl.
| G06V 10/75 | (2022.01) |
| G06N 5/048 | (2023.01) |
| H01L 29/66 | (2006.01) |
| G06F 18/22 | (2023.01) |
| G06V 10/94 | (2022.01) |

(52) U.S. Cl.
CPC ............ *G06V 10/751* (2022.01); *G06F 18/22* (2023.01); *G06N 5/048* (2013.01); *G06V 10/94* (2022.01); *H01L 29/66431* (2013.01)

(58) Field of Classification Search
CPC .......... H01L 27/1255; H01L 29/66431; G06K 9/6215; G06V 10/751; G06V 10/94; G06N 5/048; G06N 7/02; G06F 18/22
See application file for complete search history.

(56) References Cited

U.S. PATENT DOCUMENTS

| 5,222,155 A | 6/1993 | Delanoy et al. |
| 7,330,369 B2 | 2/2008 | Tran |
| 9,825,132 B2 | 11/2017 | Sedighi et al. |
| 9,998,130 B2 | 6/2018 | Pilly et al. |
| 10,096,622 B2 | 10/2018 | Gupta et al. |
| 10,374,070 B2 | 8/2019 | Wood |
| 10,439,599 B2 | 10/2019 | Nikonov et al. |

OTHER PUBLICATIONS

Kumar, Ankit, and Pritiraj Mohanty. "Autoassociative memory and pattern recognition in micromechanical oscillator network." Scientific reports 7.1 (2017): 1-9. (Year: 2017).*

(Continued)

*Primary Examiner* — Vu Le
*Assistant Examiner* — Tracy Mangialaschi
(74) *Attorney, Agent, or Firm* — Scully, Scott, Murphy & Presser, P.C.; Daniel P. Morris

(57) ABSTRACT

An apparatus for performing fuzzy template matching includes multiple damped oscillators arranged in at least one two-dimensional matrix, each of the damped oscillators being capacitively coupled to at least one adjacent damped oscillator in the matrix. The apparatus further includes peripheral circuitry coupled with the damped oscillators. The peripheral circuitry is configured to selectively interface with the damped oscillators, as a function of one or more control signals supplied to the peripheral circuitry, and to generate at least one output signal indicative of an accuracy of matching between a template pattern and an input pattern.

18 Claims, 16 Drawing Sheets

(56) References Cited

OTHER PUBLICATIONS

Shibata, Tadashi, et al. "CMOS supporting circuitries for nano-oscillator-based associative memories." 2012 13th International Workshop on Cellular Nanoscale Networks and their Applications. IEEE, 2012. (Year: 2012).*

Hu, Yingzhe, et al. "Large-scale sensing system combining large-area electronics and CMOS ICs for structural-health monitoring." IEEE Journal of Solid-State Circuits 49.2 (2014): 513-523. (Year: 2014).*

Fu, X., et al., "A New Fuzzy Based Fast and High Definition Template Matching Algorithm", 2015 IEEE 10th Conference on Industrial Electronics and Applications (ICIEA), Jun. 15-17, 2015, pp. 1803-1808.

Imamoglu, N., et al., "Adaptive Fuzzy Weighted Template Matching Using Invariant Features for a Tracking Application", IFAC Proceedings Volumes, 2010, 6 pages, vol. 43, Issue 10.

Shibata, T., et al., "CMOS Supporting Circuitries for Nano-Oscillator-Based Associative Memories", 2012 13th International Workshop on Cellular Nanoscale Networks and their Applications, Aug. 29-31, 2012, 5 pages.

Nikonov, D.E., et al., "Coupled-Oscillator Associative Memory Array Operation for Pattern Recognition", IEEE Journal on Exploratory Solid-State Computational Devices and Circuits, revised Nov. 6, 2015 and Nov. 19, 2015, accepted Nov. 23, 2015, Date of publication Nov. 25, 2015, date of current version Dec. 29, 2015, pp. 85-93, vol. 1.

Diwan, T.D., et al., "Eye Tracking and Detection by Using Fuzzy Template Matching and Parameter Based Judgment", International Journal of Computer Engineering and Technology (IJCET), Jan.-Feb. (2013), pp. 80-88, vol. 4, Issue 1.

Wu, H., et al., "Face Detection From Color Images Using a Fuzzy Pattern Matching Method", IEEE Transactions on Pattern Anaylsis and Machine Intelligence, Jun. 1999, pp. 557-563, vol. 21, No. 6.

Chen, B., et al., "Fuzzy Template Matching for Printing Character Inspection", Project: Quality inspection of mobile phone cover using industrial vision analyzing, Jan. 2004, 7 pages.

Datta, S., et al., "Neuro Inspired Computing with Coupled Relaxation Oscillators", DAC '14, Jun. 1-5, 2014, 6 pages.

Hekmatshoar, B., "Normally-Off Thin-Film Silicon Heterojunction Field-Effect Transistors and Application to Complementary Circuits", IEEE Electron Devices Letters May 2014, 2014, revised Feb. 24, 2014, accepted Feb. 26, 2014, date of publication Mar. 14, 2014, date of current version Apr. 22, 2014, pp. 545-547, vol. 35, No. 5.

Sharma, A.A., et al., "Phase Coupling and Control of Oxide-Based Oscillators for Neuromorphic Computing", IEEE Journal on Exploratory Solid-State Computational Devices and Circuits, revised Apr. 4, 2015 and May 4, 2015, accepted May 17, 2015, pp. 58-66, vol. 1.

Cosp, J., et al., "Synchronization of Nonlinear Electronic Oscillators for Neural Computation", IEEE Transactions on Neural Networks, Sep. 2004, pp. 1315-1327, vol. 15, No. 5.

Hekmatshoar, B., "Thin-Film Heterojunction FETs on Poly-Si Substrates for High-Stability Driving and Low-Power Amplification", IEEE Electron Device Letters, Oct. 2018, pp. 1528-1531, vol. 39, No. 10.

Hekmatshoar, B., et al., "Thin-Film Heterojunction Field-Effect Transistors for Ultimate Voltage Scaling and Low-Temperature Large-Area Fabrication of Active-Matrix Backplanes", 2014 IEEE International Electron Devices Meeting, Date of Conference Dec. 15-17, 2014, pp. 26.2.1-26.2.4.

Hekmatshoar, B., "Thin-Film Heterojunction Field-Effect Transistors With Crystalline Si Channels and Low-Temperature PECVD Contacts", IEEE Electron Device Letters, Jan. 2014, pp. 81-83, vol. 35, No. 1.

Hekmatshoar, B., "Thin-Film Silicon Heterojunction FETs for Large Area and Flexible Electronics: Design Parameters and Reliability", IEEE Transactions on Electron Devices, Nov. 2015, pp. 3524-3529, vol. 62, No. 11.

Kuo et al., "Applying Fuzzy Image Processing Technology to Inspect Defects of Thin Film Transistor-Liquid Crystal Display," ICAI, pp. 1-5; 2011.

Yang et al., "Damping Current Oscillation of SiC JFEI Bi-Directional Switches During Turn-on Transient," WiPDA Asia, IEEE, pp. 288-293; 2018.

* cited by examiner

*FIG. 5*
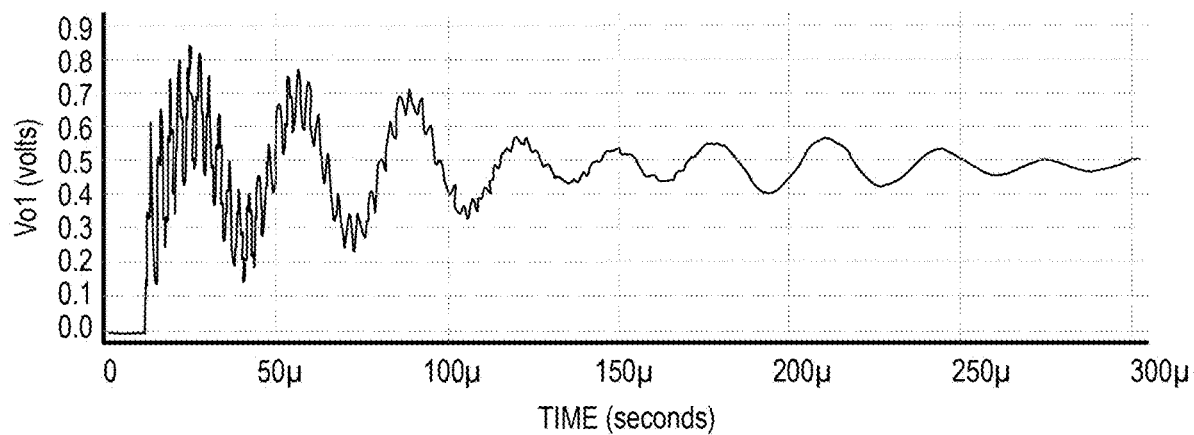
*FIG. 6A*
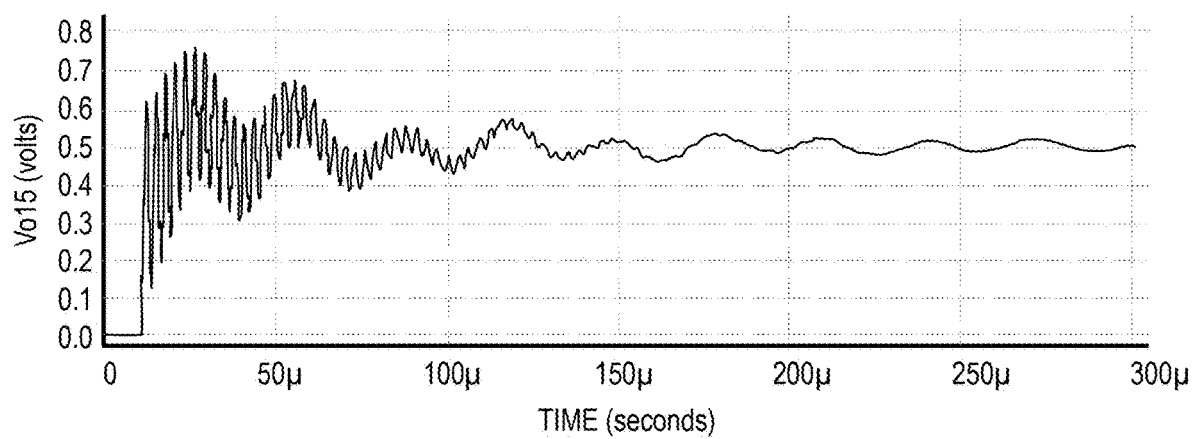
*FIG. 6B*

FIG. 17

| 1700 | 1604 | 1606 | 1608 | 1610 | 1612 | 1614 | 1616 | 1618 | 1620 |
|---|---|---|---|---|---|---|---|---|---|
| 1702 | 144.1 mV / 1.00 | 19.3 mV / 0.13 | 131.6 mV / 0.91 | 140.0 mV / 0.97 | 136.9 mV / 0.95 | 127.1 mV / 0.88 | 128.2 mV / 0.89 | 112.2 mV / 0.78 | 111.2 mV / 0.77 |
| 1704 | 19.3 mV / 0.13 | 145.9 mV / 1.00 | 59.4 mV / 0.41 | 40.8 mV / 0.28 | 51.4 mV / 0.35 | 62.9 mV / 0.43 | 75.5 mV / 0.52 | 109.5 mV / 0.75 | 98.4 mV / 0.67 |
| 1706 | 131.6 mV / 0.92 | 59.4 mV / 0.42 | 142.4 mV / 1.00 | 126.7 mV / 0.89 | 122.9 mV / 0.86 | 110.6 mV / 0.78 | 130.0 mV / 0.91 | 111.5 mV / 0.78 | 112.4 mV / 0.79 |
| 1708 | 140.0 mV / 0.97 | 40.8 mV / 0.28 | 126.7 mV / 0.88 | 144.6 mV / 1.00 | 141.3 mV / 0.98 | 128.3 mV / 0.89 | 123.8 mV / 0.86 | 108.4 mV / 0.75 | 104.1 mV / 0.72 |
| 1710 | 136.9 mV / 0.95 | 51.4 mV / 0.36 | 122.9 mV / 0.85 | 141.3 mV / 0.98 | 145.0 mV / 1.00 | 128.7 mV / 0.89 | 120.0 mV / 0.83 | 106.7 mV / 0.74 | 98.4 mV / 0.68 |
| 1712 | 127.1 mV / 0.93 | 62.9 mV / 0.46 | 110.6 mV / 0.81 | 128.3 mV / 0.94 | 128.7 mV / 0.94 | 136.5 mV / 1.00 | 109.8 mV / 0.80 | 89.7 mV / 0.66 | 112.0 mV / 0.82 |
| 1714 | 128.2 mV / 0.84 | 75.5 mV / 0.49 | 130.0 mV / 0.85 | 123.8 mV / 0.81 | 120.0 mV / 0.78 | 109.8 mV / 0.72 | 153.0 mV / 1.00 | 88.7 mV / 0.58 | 100.4 mV / 0.66 |
| 1716 | 112.2 mV / 0.69 | 109.5 mV / 0.67 | 111.5 mV / 0.68 | 108.4 mV / 0.67 | 106.7 mV / 0.66 | 89.7 mV / 0.55 | 88.7 mV / 0.54 | 162.9 mV / 1.00 | 119.8 mV / 0.74 |
| 1718 | 111.2 mV / 0.74 | 98.4 mV / 0.66 | 112.4 mV / 0.75 | 104.1 mV / 0.70 | 98.4 mV / 0.66 | 112.0 mV / 0.75 | 100.4 mV / 0.67 | 119.8 mV / 0.80 | 149.3 mV / 1.00 |

THIN-FILM ACTIVE SURFACE FOR FUZZY TEMPLATE MATCHING

BACKGROUND

The present invention relates generally to the electrical, electronic and computer arts, and, more particularly, to fuzzy template matching.

Template matching is a technique often employed in digital image processing for finding small areas or parts of an image that match a reference template image. Various template matching techniques exist and are utilized in applications such as, for example, medical imaging, sequencing of DNA, computer vision, manufacturing, for instance as a part of quality control, navigation of a mobile apparatus (e.g., a robot or vehicle), and for detecting edges in images, among other advantageous uses.

Although conventional template matching techniques can provide significant benefits in certain applications, these techniques are typically algorithmic (e.g., based on neural networks/deep learning), and while they can provide very high accuracy, they are typically too slow and/or expensive for low-cost/high-volume applications. For example, real-time (online) print quality control in production of invoices, circuit boards, instruments, glass/plastic containers, food packaging, leaflets, etc., where non-idealities attributable to friction, uneven ink spread and pressure distribution, etc., result in errors such as partly missing, distorted or diffused text or figures, may be cost- and/or time-prohibitive using conventional template matching methods.

The image quality obtained from a printed surface may be poor due to low resolution and illumination variation, inhomogeneous background and poor local contrast, thus making real-time image processing and/or classification with algorithmic methods even more challenging. Additional challenges for a template matching task include occlusion, detection of non-rigid transformations, background clutter and scale changes, among other factors.

SUMMARY

The present invention, as manifested in one or more embodiments thereof, provides an enhanced fuzzy template-matching scheme based on capacitive phase-coupling or frequency-coupling of "damped" oscillators comprised of active circuits that exhibit an inductive component in their impedance. In a phase coupling scheme, template matching is based upon phase coupling among oscillations (typically, but not necessarily, for a given fixed oscillation frequency), whereas in a frequency coupling scheme, template matching is based upon frequency coupling among oscillations (typically, but not necessarily, irrespective of the oscillation phase). In one or more embodiments, these active circuits are implemented using thin-film transistors adapted for large-area and/or flexible applications. In at least one embodiment, the damped oscillator includes a first transistor configured as a source follower, a second transistor configured as a current source, a resistor and a capacitor. In one example, the coupled damped oscillators are implemented with thin-film heterojunction field-effect transistors (FETs) and the time required for template matching is below one millisecond (ms).

In accordance with an embodiment of the invention, an apparatus for performing fuzzy template matching includes multiple damped oscillators arranged in at least one two-dimensional matrix, each of the damped oscillators being capacitively coupled to at least one adjacent damped oscillator in the matrix. The apparatus further includes peripheral circuitry coupled with the damped oscillators. The peripheral circuitry is configured to selectively interface with the damped oscillators, as a function of one or more control signals supplied to the peripheral circuitry, and to generate at least one output signal indicative of an accuracy of matching between a template pattern and an input pattern.

In accordance with another embodiment of the invention, a method for performing fuzzy template matching includes: obtaining a fuzzy template matching circuit including a plurality of damped oscillators arranged in at least one two-dimensional matrix, each of the damped oscillators being capacitively coupled to at least one adjacent damped oscillator in the matrix, and peripheral circuitry coupled with the plurality of damped oscillators; supplying an input pattern to the fuzzy template matching circuit for comparison with a reference template pattern; supplying one or more control signals to the peripheral circuitry to selectively interface with the plurality of damped oscillators; and generating, by the template matching circuit, at least one output signal indicative of an accuracy of matching between the template pattern and the input pattern.

Techniques as disclosed herein can provide substantial beneficial technical effects. By way of example only and without limitation, one or more embodiments may provide one or more of the following advantages:

provides simpler, lower-cost hardware solution compared to conventional approaches;

provides faster operation, in terms of template matching speed;

compatible with large-area and/or flexible electronics suitable for high-volume manufacturing, such as roll-to-roll production;

These and other features and advantages will become apparent from the following detailed description of illustrative embodiments thereof, which is to be read in connection with the accompanying drawings.

BRIEF DESCRIPTION OF THE DRAWINGS

Non-limiting and non-exhaustive embodiments of the present invention will be described with reference to the following drawings which are presented by way of example only, wherein like reference numerals (when used) indicate corresponding elements throughout the several views unless otherwise specified, and wherein:

FIG. 5 conceptually depicts an exemplary fuzzy template matching circuit including sixteen damped oscillators connected in a two-dimensional matrix having four rows and four columns, according to an embodiment of the present invention;

FIGS. 6A-6D are exemplary waveforms depicting output voltage, Vo1, Vo15, Vo4 and Vo9, generated by the damped oscillators in blocks 1, 15, 4 and 9, respectively, in the illustrative circuit arrangement shown in FIG. 5, according to an embodiment of the present invention;

FIG. 17 conceptually depicts a table including simulated raw and normalized matching scores for example reference patterns compared with the illustrative input templates shown in FIG. 16, according to an embodiment of the present invention;

Figure 1A:
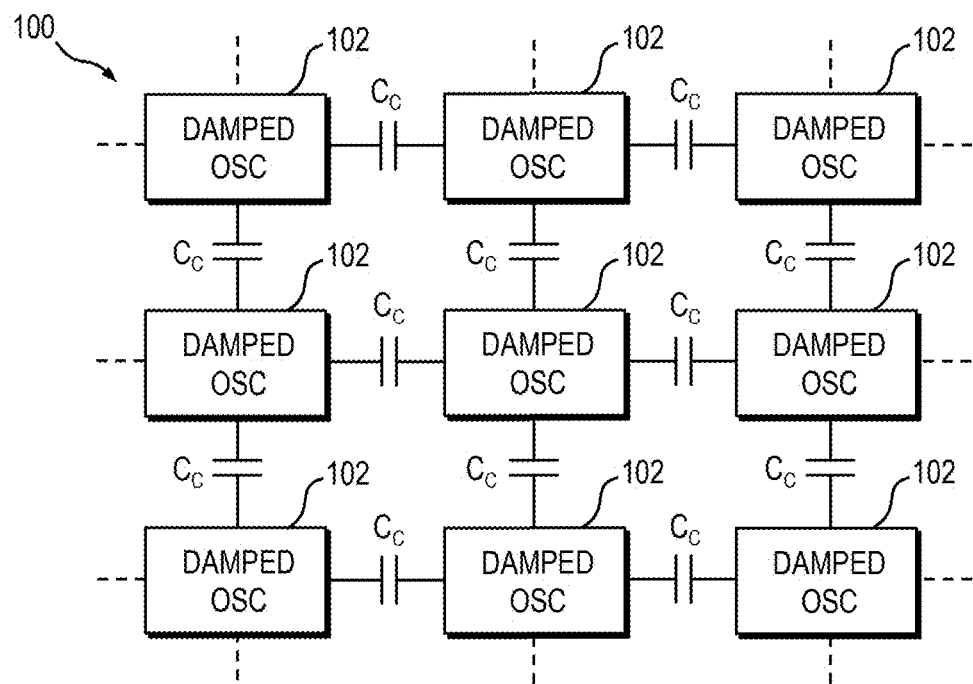
FIGS. 1A and 1B are schematic diagrams depicting at least a portion of exemplary circuits suitable for use in a fuzzy template matching system, according to embodiments of the present invention.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present disclosure will be described herein in the context of illustrative fuzzy template matching circuits based on capacitive phase-coupling or frequency-coupling of damped oscillators, and methods for fabricating such circuits. It is to be appreciated, however, that the specific circuits and/or methods illustratively shown and described herein are to be considered exemplary as opposed to limiting. Moreover, it will become apparent to those skilled in the art given the teachings herein that numerous modifications can be made to the embodiments shown that are within the scope of the appended claims. That is, no limitations with respect to the embodiments shown and described herein are intended or should be inferred.

Although the overall fabrication method and the structures for the disclosed embodiments are entirely novel, certain individual processing steps required to implement the structure and/or circuitry may utilize conventional semiconductor fabrication techniques and conventional semiconductor fabrication tooling. These techniques and tooling will already be familiar to one having ordinary skill in the relevant art given the teachings herein. Moreover, many of the processing steps and tooling used to fabricate semiconductor devices are also described in a number of readily available publications, including, for example: James D. Plummer et al., *Silicon VLSI Technology*, Prentice Hall; 2 edition (Nov. 11, 2008); and James D. Plummer et al., *Silicon VLSI Technology: Fundamentals, Practice, and Modeling*, Pearson; 1 edition (Jul. 24, 2000), both of which are hereby incorporated by reference herein in their entireties. It is emphasized that while some individual processing steps may be set forth herein, those steps are merely illustrative, and one skilled in the art may be familiar with several equally suitable alternatives that would also fall within the scope of the present disclosure.

It is to be appreciated that the various layers, regions and/or components shown in the accompanying figures may not be drawn to scale. Furthermore, one or more semiconductor layers of a type commonly used in such integrated circuit structures may not be explicitly shown in a given figure for economy of description. This does not imply, however, that the semiconductor layer(s) not explicitly shown are omitted in the actual integrated circuit structure.

With regard to fuzzy template matching, embodiments of the present invention exploit the discovery that oscillatory coupling does not require sustained oscillation, but rather damped oscillators can be employed to achieve the same or comparable performance. The use of damped oscillators is advantageous because, among other benefits, they can be implemented using conventional integrated circuit (IC) fabrication techniques, and with less hardware overhead compared to sustained oscillators. In one or more embodiments, an active circuit exhibiting an inductive component in its impedance is used in conjunction with a capacitive load to create a damped oscillator.

FIG. 1A is a schematic diagram depicting at least a portion of an exemplary circuit 100 suitable for use in a fuzzy template matching system, according to an embodiment of the invention. The circuit 100 includes a plurality of damped oscillators 102 arranged in a two-dimensional matrix or array. The damped oscillators 102 are coupled to one another using capacitive coupling. More particularly, the illustrative circuit 100 includes a plurality of coupling capacitors, $C_C$, with each coupling capacitor connected between horizontally and vertically adjacent damped oscillators 102, as shown in FIG. 1A. Although nine damped oscillators 102 are depicted in the circuit 100 (arranged into three rows and three columns), it is to be appreciated that embodiments of the invention are not limited to any specific number or arrangement of the damped oscillators.

Figure 1B:
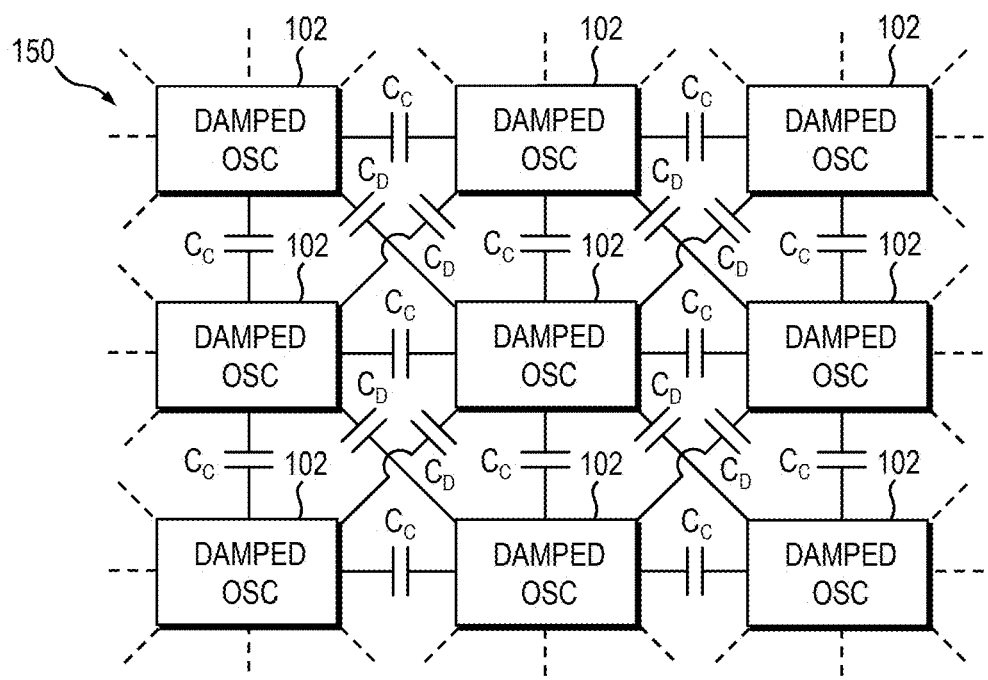

Various connectivity schemes are contemplated for coupling the damped oscillators to one another, such as, but not limited to, schemes similar to those used in the art for neural networks (including networks with feedback). For example, FIG. 1B is a schematic diagram depicting at least a portion of an exemplary circuit 150 suitable for use in a fuzzy template matching system, according to an alternative embodiment of the invention. The circuit 150, like the illustrative circuit 100 shown in FIG. 1A, includes a plurality of damped oscillators 102 arranged in a two-dimensional matrix. The illustrative circuit 150 includes a first plurality of coupling capacitors, $C_C$, with each coupling capacitor $C_C$ connected between horizontally and vertically adjacent damped oscillators 102, and a second plurality of coupling capacitors, $C_D$, with each coupling capacitor $C_D$ connected between diagonally adjacent damped oscillators.

In one or more alternative embodiments, a fuzzy template matching circuit may include a plurality of damped oscillators arranged three-dimensionally in multiple layers of vertically stacked arrays, as will be described in further detail herein below. Again, it is to be understood that embodiments of the invention are not limited to any specific number and/or connection configuration of the damped oscillators.

Figure 2A:
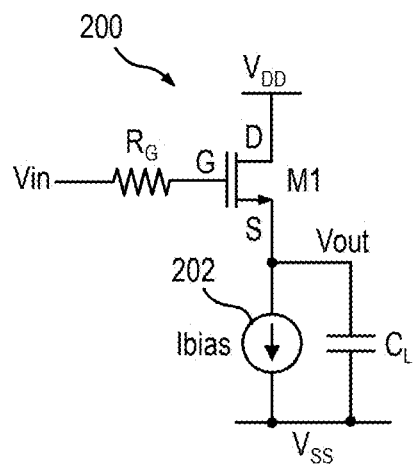
FIGS. 2A and 2B are schematic diagrams depicting at least a portion of an exemplary damped oscillator circuit and corresponding small signal model, respectively, suitable for use in a fuzzy template matching circuit, according to embodiments of the present invention.
Figure 2B:
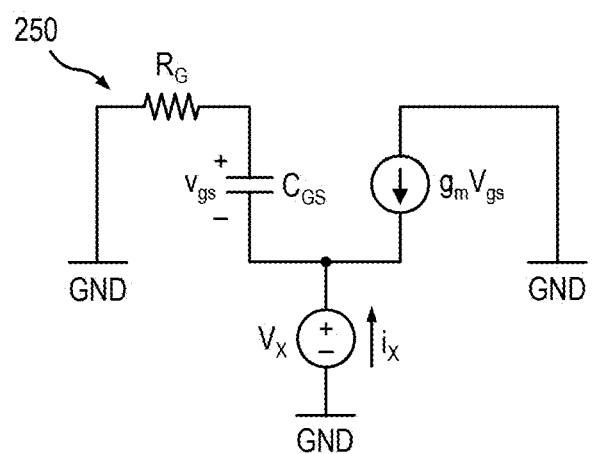

FIGS. 2A and 2B are schematic diagrams depicting at least a portion of an exemplary damped oscillator circuit 200 and corresponding small signal model 250, respectively, suitable for use in a fuzzy template matching circuit, according to embodiments of the invention. With reference to FIG. 2A, the damped oscillator circuit 200 is comprised of a field-effect transistor (FET) M1, such as an n-channel metal-oxide semiconductor field-effect transistor (MOSFET), connected in a source follower configuration, with a gate resistor and a capacitive load. Specifically, the damped oscillator circuit 200 includes a FET device, M1, having a drain (D) connected to a first voltage source, which is VDD in this embodiment, a gate (G) connected to a first terminal of a gate resistor, $R_G$, and a source (S) connected to a first terminal of a load capacitor, $C_L$. A second terminal of the load capacitor $C_L$ is connected to a second voltage source, which is VSS in this embodiment. The damped oscillator circuit 200 further includes a bias source 202 connected between the source of the FET device M1 and VSS. The bias source 202 is configured to generate a fixed bias current, Ibias, that flows from the source of M1 to VSS. A second terminal of the gate resistor $R_G$ is adapted to receive an input signal, Vin, and an output signal, Vout, of the damped oscillator circuit 200 is generated at the source of the FET device M1.

FIG. 2B is a circuit 250 corresponding to a small signal model of the illustrative damped oscillator circuit 200 shown in FIG. 2A. In the small signal model circuit 250, the gate resistor $R_G$ is connected between ground (GND), which may be a virtual (AC) ground, and a first terminal of a capacitor, $C_{GS}$, representing parasitic gate-to-source capacitance of the FET device M1 shown in FIG. 2A. A voltage, $v_{gs}$, developed across the capacitor $C_{GS}$ is indicative of the gate-to-source voltage of the FET device M1 in FIG. 2A. A second terminal of the capacitor $C_{GS}$ is connected to a voltage source 252, generating a voltage $V_X$ and a current $i_X$, and a current source 254, generating a current $g_m v_{gs}$. For simplicity, it is assumed that a parasitic capacitance, $C_{GD}$, between the gate and drain of the FET device M1, a body transconductance, $g_{mb}$, and a drain-to-source transconductance, $g_{ds}$, of M1 are negligible, and the current source 254 is ideal. However, it is straightforward to include these components in the small signal model. As will be known by those skilled in the art, the presence of $C_{GD}$ increases the effective $C_{GS}$ due to Miller effect. If desired, an external capacitor may also be added between the gate and source of FET device M1 to further increase the effective $C_{GS}$.

With reference to the small signal model circuit 250, the frequency of oscillation of the damped oscillator circuit 200 can be determined using the following expressions:

$$Z_{out} = \frac{v_x}{i_x} = \frac{1 + j\omega R_G C_{GS}}{g_m + j\omega C_{GS}} \quad (1)$$

$$= \frac{1}{g_m} + \left(R_G - \frac{1}{g_m}\right) \Big\| \left[\frac{j\omega C_{GS}}{g_m}\left(R_G - \frac{1}{g_m}\right)\right] \quad (2)$$

$$\Rightarrow f_{osc} = \frac{1}{2\pi\sqrt{\frac{C_{GS} C_L}{g_m}\left(R_G - \frac{1}{g_m}\right)}} \quad (3)$$

While the FET devices M1 and M2 are illustrated as enhancement-mode metal-oxide FET (MOSFET) devices in FIG. 2A, other types of FET devices including depletion-mode MOSFET and junction (or heterojunction) FET devices may be used as well. The small signal model of FIG. 2B is applicable to all types of FET devices as appreciated by those familiar with the art. In addition, while the FET devices M1 and M2 are n-channel transistors in this example, p-channel transistors may be used as well with minor adjustments to account for opposite voltage polarities, as will become apparent to those skilled in the relevant art.

Figure 3:
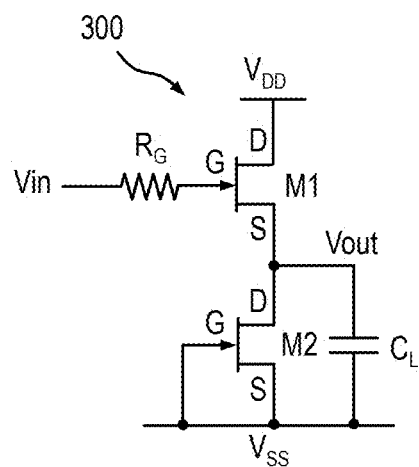
FIG. 3 is a schematic diagram depicting an exemplary damped oscillator circuit for implementing the illustrative circuit shown in FIG. 2A, according to an embodiment of the present invention.

FIG. 3 is a schematic diagram depicting an exemplary damped oscillator circuit 300 for implementing the illustrative circuit 200 shown in FIG. 2A, using junction (or heterojunction) FET devices, according to an embodiment of the invention. In the damped oscillator circuit 300, the current source (202 in FIG. 2A) is realized using a junction FET device, M2, having a gate and source connected to VSS and a drain connected to the source of FET device M1. As will be known by those skilled in the art, a junction FET is a normally-on transistor, and thus applying a zero gate-to-source bias (for example, by connecting the gate to the source of the device as described above) creates a substantially bias-independent (i.e., fixed) current source with a high output resistance.

Similarly, a depletion-mode FET, which is a normally-on transistor, may be used to implement a current source by connecting a gate to a source terminal. However, for a normally-off transistor, such as an enhancement-mode FET, a current source may be implemented by connecting a gate to a drain (rather than a source) terminal; i.e. applying zero gate-to-drain bias. As will be known by those skilled in the art, such a current source (also known as an active-load) has a higher bias dependence and lower output resistance compared to a current source comprised of a normally-on transistor with zero gate-to-source bias; nevertheless, a current source comprised of a normally-off transistor as described may also be used in some embodiments. An active load may also be formed by applying a zero gate-to-drain bias to a normally-on transistor. In one example, transistors M1 and M2 are thin-film silicon heterojunction field-effect transistor (HJFET) devices.

Using expression (3) above, and assuming a gate-to-source capacitance $C_{GS}=2$ picofarad (pF), a load capacitor $C_L$=1 pF, a gate resistor $R_G$=35 megohm (MΩ), and a transconductance $g_m$=0.3 milliampere per volt (mA/V), the frequency of oscillation, $f_{osc}$, of the damped oscillator circuit 300 is estimated to be about 330 kilohertz (KHz). Simulated waveforms showing an input voltage Vin applied to the damped oscillator circuit 300 and a corresponding output voltage Vout generated by the damped oscillator circuit are shown in FIGS. 4A and 4B, respectively.

Figure 4A:
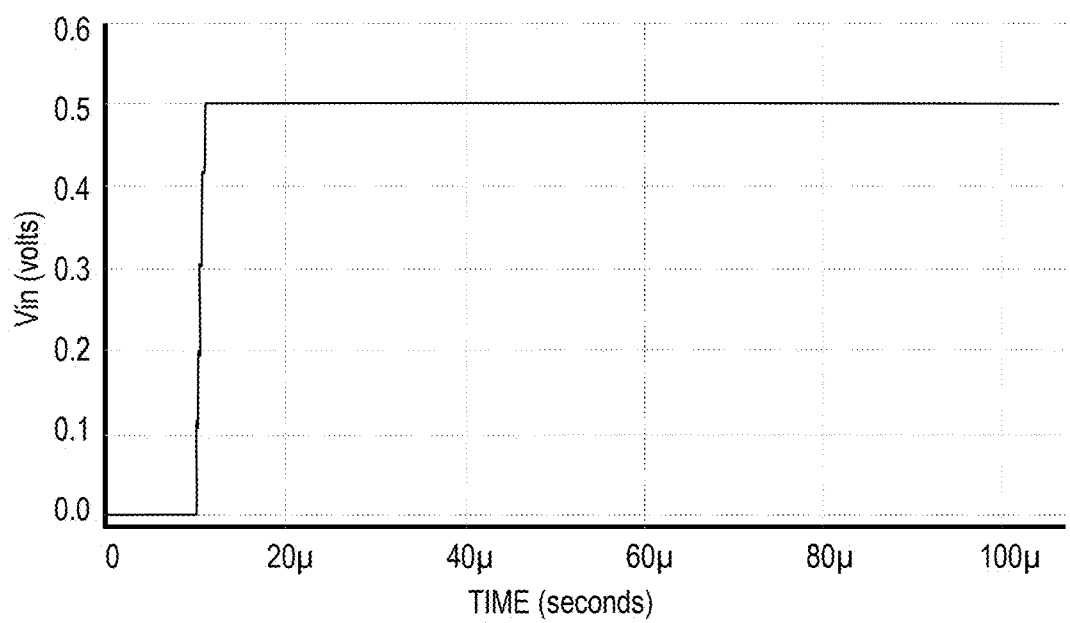
FIGS. 4A and 4B are simulated waveforms showing an input voltage applied to the illustrative damped oscillator circuit shown in FIG. 3 and a corresponding output voltage generated by the damped oscillator circuit, respectively, according to an embodiment of the present invention.
Figure 4B:
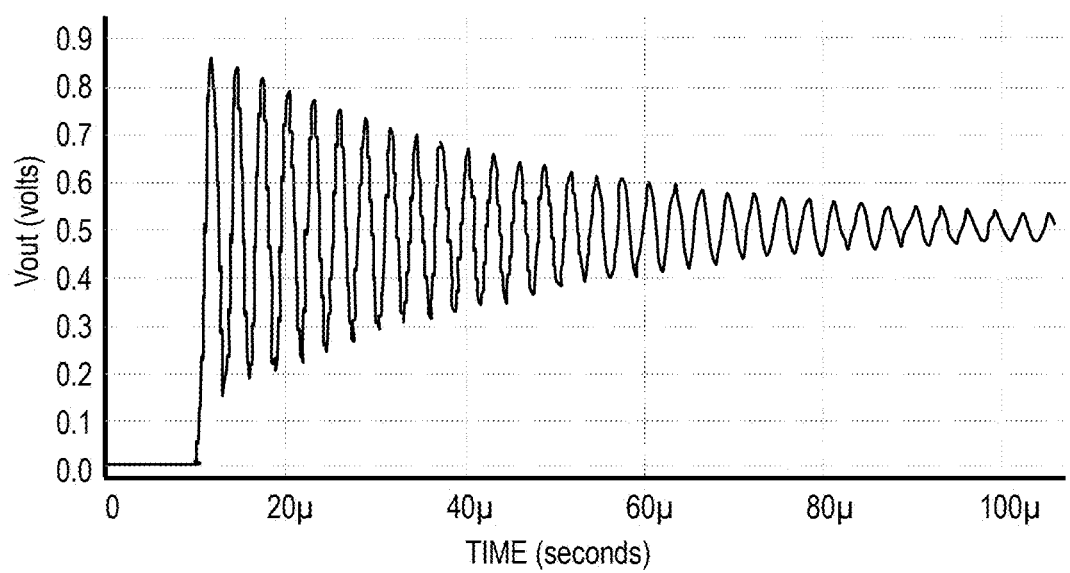
Figure 6C:
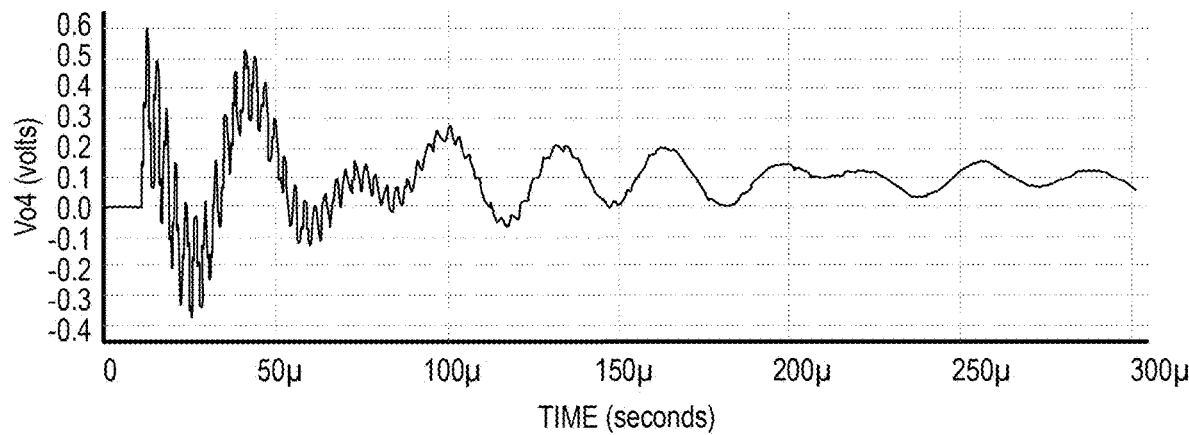
Figure 6D:
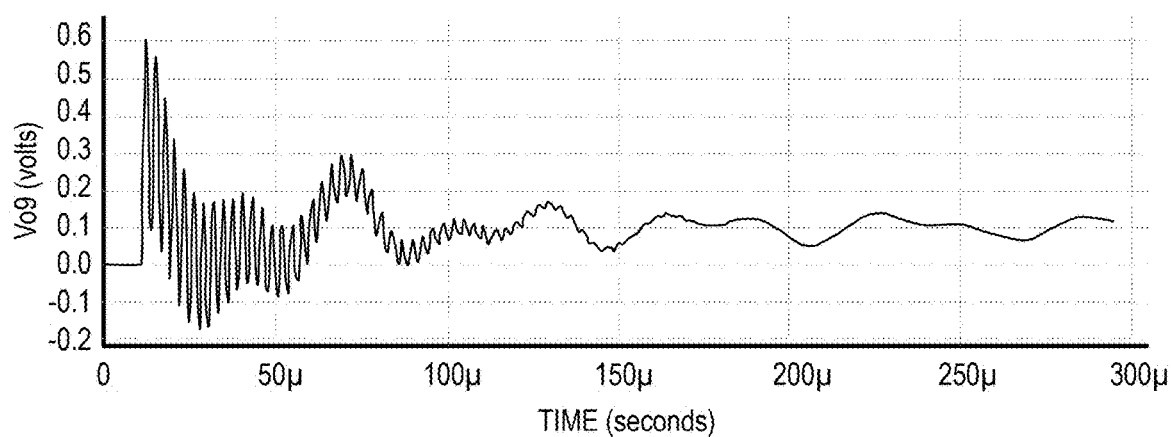

With reference to FIG. 4A, the input voltage Vin, in this exemplary simulation, is in the form of a voltage step function which jumps from zero to 0.5 volt (V) after about 10 μs. As apparent from FIG. 4B, once Vin is at 0.5 V, the output voltage Vout of the damped oscillator circuit 300 begins to exhibit oscillations at approximately the frequency determined using expression (3) above. In this example, the period of oscillation is about 3 μs (or about 333 KHz). Also apparent from FIG. 4B is a gradual reduction in amplitude of the output voltage Vout, as is characteristic of a damped oscillator circuit.

As can be seen from expression (2) above, the output impedance of the illustrative damped oscillator circuit 200 of FIG. 2A may be represented by an effective inductance of $L_{eff}=[C_{gs}/g_m(R_G-1/g_m)]$, which has an effective parallel resistance of $R_P=R_G-1/g_m$ and an effective series resistance of $R_S=1/g_m$. The oscillation frequency is determined by coupling between $L_{eff}$ and $C_L$, i.e. $f_{osc}=1/2\pi\sqrt{L_{eff}C_L}$, while $R_p$ and $R_S$ dampen the oscillation. Desired oscillatory behavior may therefore be obtained by proper choice of circuit elements including transistor parameters. It should be noted that the input voltage (Vin) waveform is not limited to a step function and various other waveforms (including but not limited to single or multi-level pulses) may be used as well. In addition, as known in the art, the input waveform may have non-idealities such as overshoots, undershoots and ripples due to non-idealities associated with the driver circuitry.

By way of example only and without limitation, consider an embodiment including sixteen damped oscillators connected in a two-dimensional matrix having four rows and four columns, as shown in FIG. 5. This embodiment depicts at least a portion of a fuzzy template matching circuit and is provided with an example simulation to illustrate the feasibility of phase coupling between damped oscillators. Each of the damped oscillators is preferably implemented in a manner consistent with the damped oscillator circuit 300 shown in FIG. 3. In one or more embodiments, the damped oscillators, numbered 1 through 16 in FIG. 5, are connected to one another with horizontal and vertical coupling capacitors between nearest neighbors (e.g., see FIG. 1A).

With reference to FIG. 5, each of the damped oscillators represented by white blocks (namely, blocks 1, 2, 5-7, 10-12, 15 and 16) are configured to receive an input signal Vin of 0.5 V (a step function, as in FIG. 4A, in this example), and each of the damped oscillators represented by gray blocks (namely, blocks 3, 4, 8, 9, 13 and 14) are configured to receive an input signal Vin of 0.1 V (a step function, in this example). FIGS. 6A-6D are exemplary waveforms depicting output voltages, Vo1, Vo15, Vo4 and Vo9, generated by the damped oscillators in blocks 1, 15, 4 and 9, respectively, in the illustrative circuit arrangement shown in FIG. 5, according to an embodiment of the invention. As apparent from FIGS. 6A-6D, the damped oscillators oscillate in phase with each other for blocks of the same color (e.g., FIGS. 6A-6B and 6C-6D), and oscillate out of phase with one another for opposite color blocks (e.g., FIGS. 6A-6C and 6B-6D).

Figure 7:
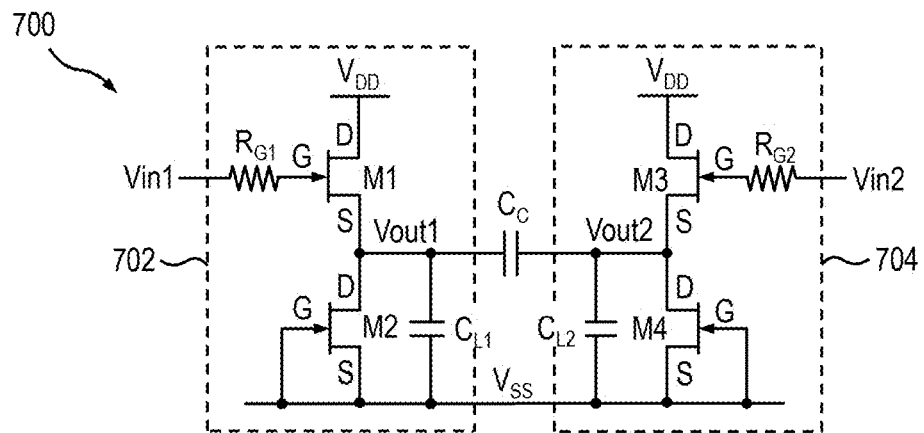
FIG. 7 is a schematic diagram depicting at least a portion of an illustrative circuit including two damped oscillators connected together via a coupling capacitor, according to an embodiment of the present invention.

In one or more embodiments, a plurality of neighboring damped oscillator circuits are preferably capacitively coupled to form a matrix (e.g., FIGS. 1A and 1B), as previously stated. By way of example only and without limitation, FIG. 7 is a schematic diagram depicting at least a portion of an illustrative circuit 700 including two damped oscillators, in accordance with an embodiment of the invention, and is provided with a simulation example to illustrate the feasibility of frequency coupling between damped oscillators. Specifically, a first damped oscillator 702 is formed comprising a first FET device, M1, having a drain connected with a first voltage source, which may be $V_{DD}$, a gate connected in series with a gate resistor, $R_{G1}$, and adapted to receive an input signal, Vin1, and a source connected with a first terminal of a load capacitor, $C_{L1}$. A second terminal of the load capacitor $C_{L1}$ is connected with a second voltage source, which may be $V_{SS}$. The first damped oscillator 702 further includes a second FET device, M2, having a drain connected with the source of the FET M1, and a gate and a source connected with the second voltage source $V_{SS}$. A first output signal, Vout1, is generated at a junction of the source of FET M1, the drain of FET M2, and the first terminal of the load capacitor $C_{L1}$. In this illustrative embodiment, the FET device M2 is a normally-on transistor (e.g., a junction FET as illustrated, or a depletion-mode FET) implementing a current source by connecting a gate terminal to a source terminal, as previously described with respect to FIG. 3.

Similarly, a second damped oscillator 704 is formed comprising a third FET device, M3, having a drain connected with the first voltage source $V_{DD}$, a gate connected in series with a gate resistor, $R_{G2}$, and adapted to receive an input signal, Vin2, and a source connected with a first terminal of a load capacitor, $C_{L2}$. A second terminal of the load capacitor $C_{L2}$ is connected with the second voltage source $V_{SS}$. The second damped oscillator 704 further includes a fourth FET device, M4, having a drain connected with the source of the FET M3, and a gate and a source connected with $V_{SS}$. A second output signal, Vout2, is generated at a junction of the source of FET M3, the drain of FET M4, and the first terminal of the load capacitor $C_{L2}$. In this illustrative embodiment, the FET device M4 is a normally-on transistor (e.g., a junction FET as illustrated, or a depletion-mode FET) implementing a current source by connecting a gate terminal to a source terminal, as previously described with respect to FIG. 3.

In this illustrative embodiment, output nodes of the two damped oscillators 702 and 704 are coupled together with a coupling capacitor, $C_C$. Specifically, a first terminal of the coupling capacitor $C_C$ is connected with a source of the FET M1 and a second terminal of capacitor $C_C$ is connected with a source of the FET M3.

Figure 8:
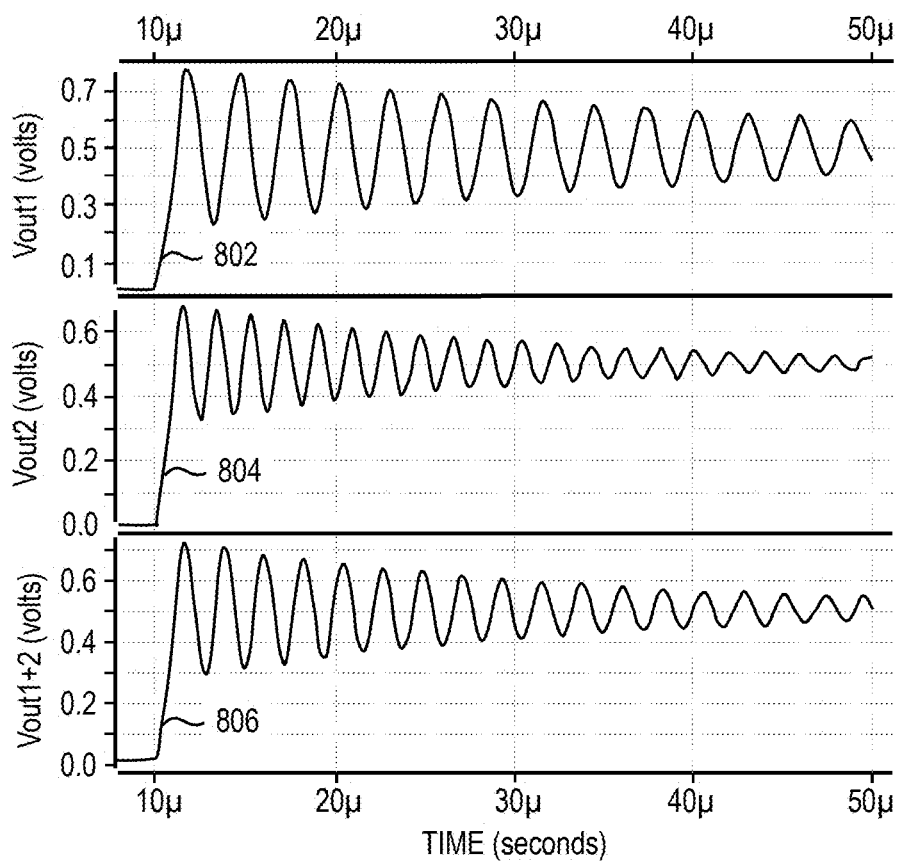
FIG. 8 is a graph depicting exemplary waveforms generated by the illustrative circuit of FIG. 7, according to an embodiment of the present invention.

With reference now to FIG. 8, exemplary waveforms generated by the circuit 700 of FIG. 7 are shown; waveform 802 represents the output signal Vout1 of the first damped oscillator 702 when it is uncoupled from the second damped oscillator 704 (i.e., in the absence of $C_C$), waveform 804 represents the output signal Vout2 of the second damped oscillator 704 when it is uncoupled from the first damped oscillator 702 (i.e., in the absence of $C_C$), and waveform 806 represents the output signals Vout1 and Vout2 superimposed on one another when the first and second damped oscillators are coupled together (i.e., with $C_C$ present). In generating these waveforms, it is assumed that each of the input signals Vin1 and Vin2 are 0.5 V, as shown in FIG. 4A, $R_{G1}$ is 35 MΩ, and $R_{G2}$ is 15 MΩ. As apparent from FIG. 8, the uncoupled output signal Vout1 (802) has an oscillation frequency of about 330 KHz, the uncoupled output signal Vout2 (804) has an oscillation frequency of about 510 KHz, and the coupled output signals Vout1 and Vout2 (806) have an oscillation frequency of about 430 KHz.

Figure 9:
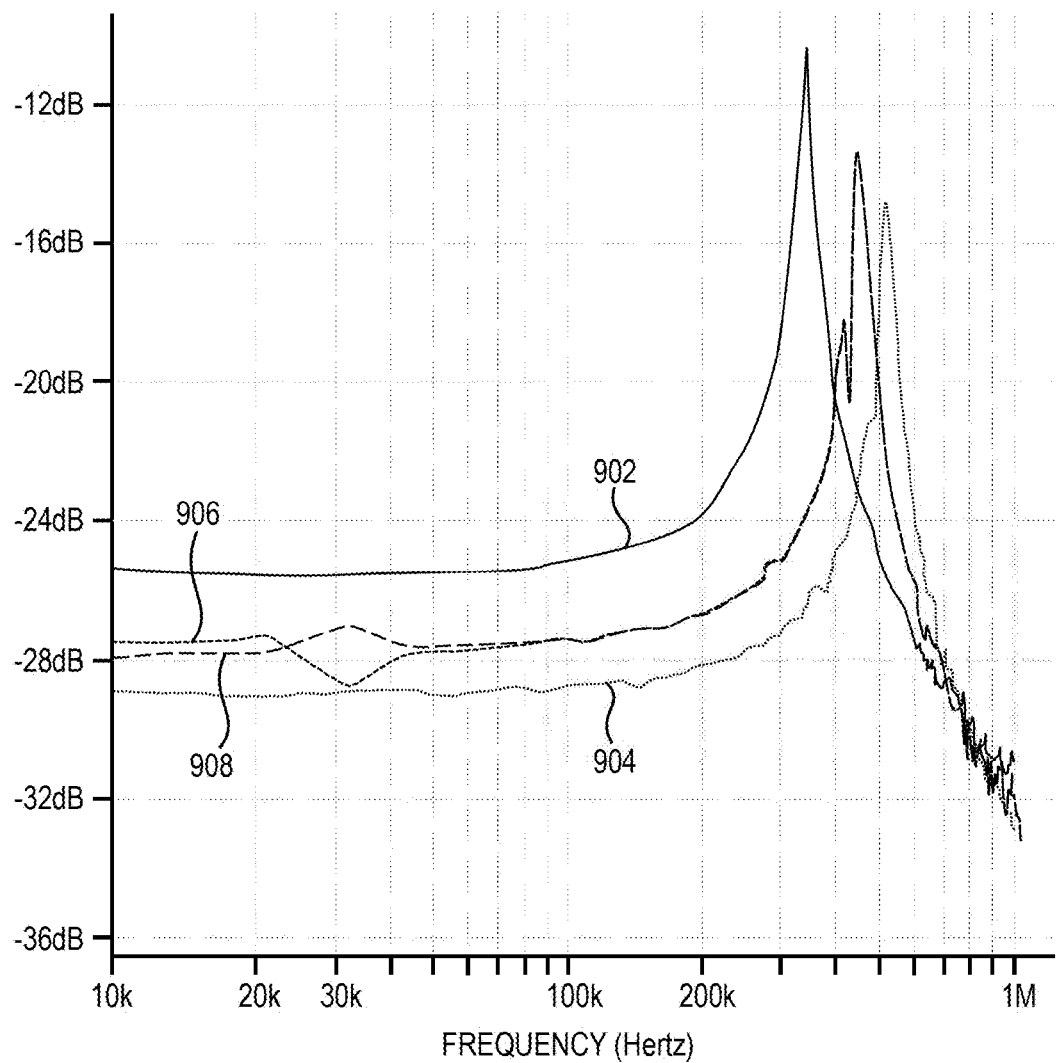
FIG. 9 is a graph depicting a fast Fourier transform (FFT) of the exemplary waveforms shown in FIG. 8 in the frequency domain, according to an embodiment of the present invention.

FIG. 9 is a graph conceptually depicting a fast Fourier transform (FFT) of the exemplary waveforms shown in FIG. 8 in the frequency domain. With reference to FIG. 9, waveform 902 represents the FFT of output signal Vout1 with damped oscillators 702 and 704 uncoupled from one another, waveform 904 represents the FFT of output signal Vout2 with damped oscillators 702 and 704 uncoupled from one another, waveform 906 represents the FFT of Vout1 with damped oscillators 702 and 704 coupled together, and waveform 908 represents the FFT of Vout2 with damped oscillators 702 and 704 coupled together. As apparent from FIG. 9, waveform 902 indicates that most of the power in the uncoupled output signal Vout1 is at about 330 KHz, waveform 904 indicates that most of the power in the uncoupled output signal Vout2 is at about 510 KHz, and waveforms 906 and 908 indicate that most of the power in the coupled output signals Vout1 and Vout2 is at about 430 KHz, which coincide with the results shown in FIG. 8.

Figure 10:
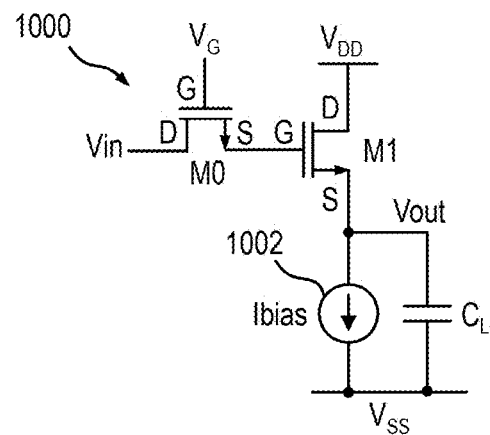
FIG. 10 is a schematic diagram depicting at least a portion of an exemplary damped oscillator circuit with variable oscillation frequency, according to an embodiment of the present invention.
Figure 11:
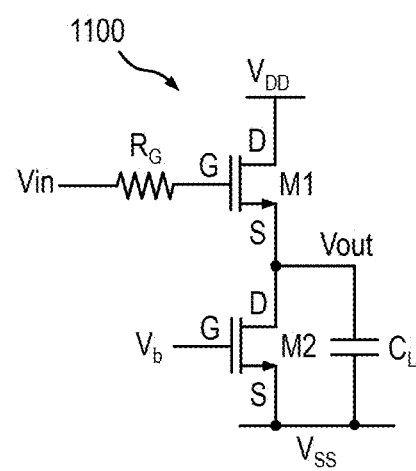
FIG. 11 is a schematic diagram depicting at least a portion of an exemplary damped oscillator circuit with variable oscillation frequency, according to an alternative embodiment of the present invention.

In one or more embodiments, the exemplary damped oscillator circuit 200 shown in FIG. 2A can be modified to provide a damped oscillator which generates an output signal having a variable oscillation frequency. This can be achieved in multiple ways, two examples of which are shown in FIGS. 10 and 11, according to embodiments of the invention. More particularly, FIG. 10 is a schematic diagram depicting at least a portion of an exemplary damped oscillator circuit 1000 with variable oscillation frequency, according to an embodiment of the invention. In the damped oscillator circuit 1000, a variable oscillation frequency is obtained by replacing the gate resistor $R_G$ of the circuit 200 shown in FIG. 2A with a pass transistor, M0, having a source connected with the gate of FET M1, a gate adapted to receive a control signal, $V_G$, and a drain adapted to receive input signal Vin. In this embodiment, the frequency of oscillation is controllable as a function of the signal $V_G$ applied to the gate of the pass transistor M0.

More specifically, the channel resistance ($R_{ch}$) of pass transistor M0 (functioning as $R_G$ in FIGS. 2A and 2B) is modulated by $V_G$. As known, $R_{ch}$ is approximately proportional to ($V_{GS}-V_T$) for a MOSFET biased in the linear regime where $V_T$ is the threshold voltage of the MOSFET. As pass transistor M0 is biased in the linear regime with small voltage drop across the channel (since the gate current of M1 and therefore the drain current of M0 is very small), Vs is approximately equal to $V_D$=Vin and therefore $R_{ch}$ is approximately proportional to $V_G-V_{in}-V_T$, provided that $V_G-V_{in}$ is sufficiently larger than $V_T$ to switch on pass transistor M0. Similarly, for a junction (or heterojunction) FET, $R_{ch}$ is approximately proportional to $V_G-V_{in}-V_P$, where $V_p$ is the pinch-off voltage of the junction (or heterojunction) FET.

Similarly, FIG. 11 is a schematic diagram depicting at least a portion of an exemplary damped oscillator circuit 1100 with variable oscillation frequency, according to another embodiment of the invention. In the damped oscillator circuit 1100, a variable oscillation frequency is obtained by replacing the constant bias current source 202 of the circuit 200 shown in FIG. 2A with a variable current source controlled by a signal, $V_b$. In this embodiment, the variable current source is implemented using an n-channel MOSFET, M2, although other means of implementing a controllable current source are similarly contemplated by embodiments of the invention. More particularly, the MOSFET M2 includes a source connected with $V_{SS}$, a drain connected with the source of FET device M1, and a gate adapted to receive the control signal $V_b$. In this embodiment, the frequency of oscillation is controllable as a function of the signal $V_b$ applied to the gate of the MOSFET M2. More specifically, the drain current of M2 (functionally equivalent to $I_{bias}$ in FIG. 2A, and therefore the drain current of M1 in FIG. 2A and thus $g_m$ in FIG. 2B) is controllable as a function of the signal $V_b$.

With reference to FIGS. 10 and 11, in some embodiments, Vin may be connected to a constant reference voltage, which may be $V_{DD}$ in some embodiments, while control signals $V_G$ or $V_b$ are used as input signals. In other embodiments, Vin may be connected to a global clock or trigger signal with proper timing with respect to signals $V_G$ or $V_b$, which may be used as input signals.

While the feasibility of oscillatory coupling was illustrated by phase coupling and frequency coupling examples with respect to FIGS. 5-11, it will be appreciated that phase and frequency are not the only parameters that could be used as a basis for determining the status or degree of coupling. While phase and frequency are beneficial, particularly in allowing simple readout schemes and peripheral circuitry, in principle, any output function of a coupled damped oscillator may be used as a metric. For example, Vout may be digitized using an analog-to-digital converter, and a mathematical function of Vout calculated with the aid of a digital processor may be used as a metric. Such a mathematical function may be, for example, a complex function of phase and/or frequency, or be time-dependent (e.g., including Vout, derivatives and/or integrals of Vout).

Figure 12:
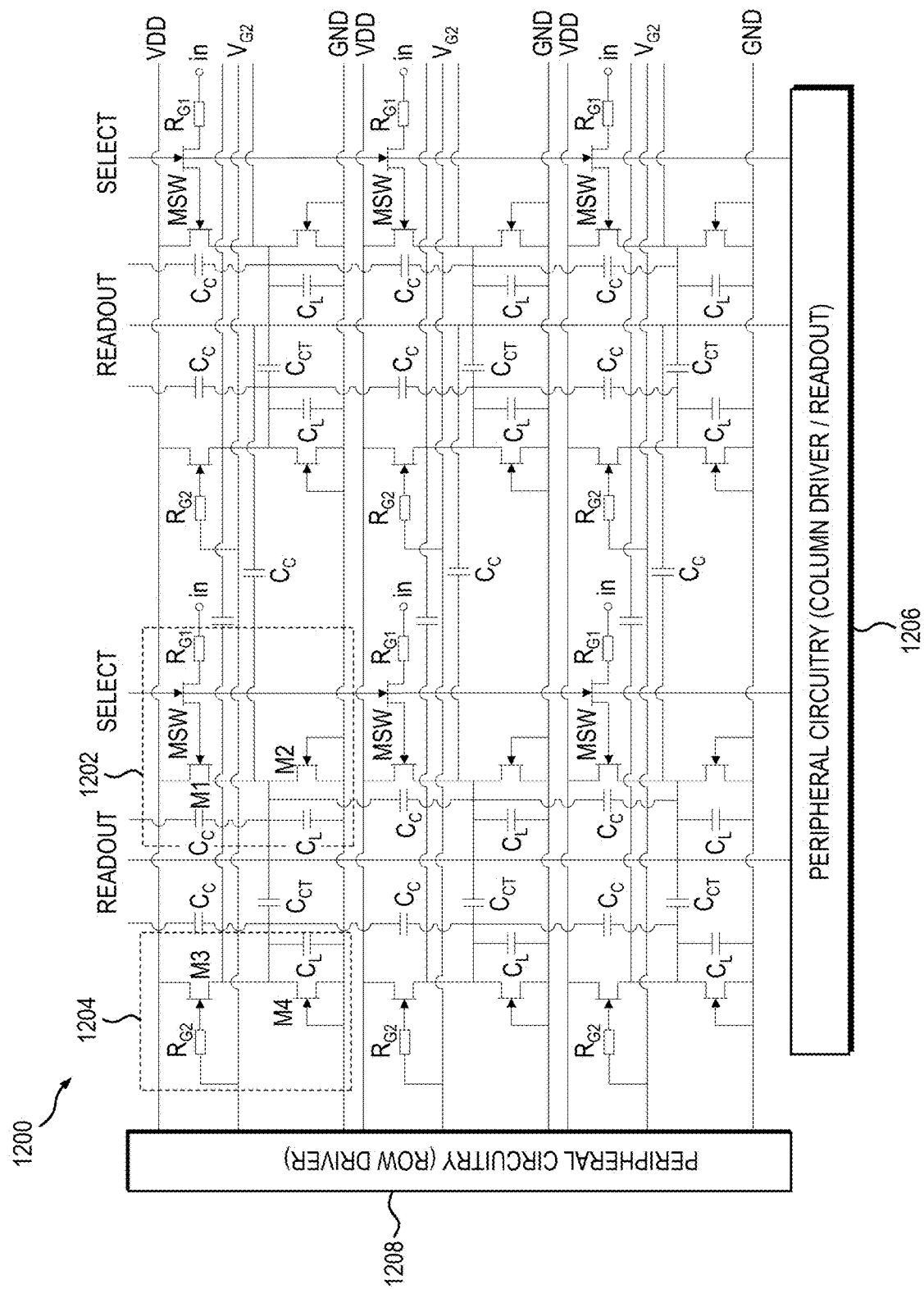
FIG. 12 is a schematic diagram depicting at least a portion of an exemplary fuzzy template matching circuit including a two-dimensional matrix of damped oscillators, according to an embodiment of the present invention.

FIG. 12 is a schematic diagram depicting at least a portion of an exemplary fuzzy template matching circuit 1200 including a two-dimensional matrix of damped oscillators, according to an embodiment of the invention. Specifically, the circuit 1200 includes a plurality of damped oscillators (e.g., 1202 and 1204) arranged in a two-dimensional matrix or array, where a first set of damped oscillators (e.g., 1202) are configured to receive input signals from input (in) lines, and a second set of damped oscillators (e.g., 1204) are configured to receive reference signals from reference lines, $V_{G2}$ (e.g., provided by a row driver circuit), with each of at least a subset of the first set of damped oscillators being capacitively coupled with vertically and horizontally adjacent neighboring damped oscillators in the first set using coupling capacitors, $C_C$, as described in conjunction with FIG. 1A, and similarly, with each of at least a subset of the second set of damped oscillators being capacitively coupled with vertically and horizontally adjacent neighboring damped oscillators in the second set using coupling capacitors, $C_C$, also as described in conjunction with FIG. 1A. Moreover, in this exemplary embodiment, at least a subset of the first set of damped oscillators are capacitively coupled with horizontally adjacent neighboring damped oscillators of the second set using coupling capacitors, $C_{CT}$. The coupling capacitors $C_{CT}$ are optional and may omitted in some embodiments. Although only three rows and two columns are illustrated in this example, it is to be understood that embodiments of the invention are not limited to any specific number of rows and columns, or to any specific arrangement of the damped oscillators.

The circuit 1200 further includes peripheral circuitry for interfacing with the matrix of damped oscillators. The peripheral circuitry includes a column driver/readout circuit 1206 and a row driver circuit 1208. The column driver/readout circuit 1206 is connected to one or more readout lines, each of the readout lines being coupled to respective output nodes of the damped oscillators in a corresponding column. In this exemplary embodiment, only the outputs of the first set of damped oscillators are connected to corresponding readout lines. This arrangement is sufficient, provided that the output responses of the second set of damped oscillators to all reference inputs (templates) of interest are known (for example, from previous measurements) and do not need to be remeasured during normal operation. However, in some embodiments (not explicitly shown, but implied), the outputs of the second set of damped oscillators are also connected to corresponding readout lines to allow readout during normal operation, which is beneficial, for instance, in compensating for the long-term drift of device characteristics or allowing the use of new reference inputs (templates). The column driver/readout circuit 1206 is further connected to one or more select lines for selectively enabling individual damped oscillators in the matrix. In this exemplary embodiment, input (in) lines connected to each of the damped oscillators (e.g., 1202) are multiplexed using switching transistors, MSW, selectively activated by corresponding control signals supplied on the select lines. Although not explicitly shown, in one or more embodiments, the readout lines may be multiplexed using switching transistors and corresponding select lines in a manner consistent with the switching transistors MSW and select lines used for multiplexing the input lines of the damped oscillators.

The row driver circuit 1208 is connected to one or more reference input lines, $V_{G2}$, each of the reference input lines being coupled to respective gate resistors, $R_{G2}$, of the damped oscillators (e.g., 1204) in a corresponding row. The reference input lines are used to provide signals indicative of a reference pattern or template to which an input pattern or template is being matched. The row driver circuit 1208 may further provide voltage supply lines (e.g., VDD and GND) for powering the damped oscillators. Although not explicitly shown, in one or more embodiments, the reference input lines may be multiplexed using switching transistors and corresponding select lines in a manner consistent with the switching transistors MSW and select lines used for multiplexing the input lines of the damped oscillators.

Figure 13:
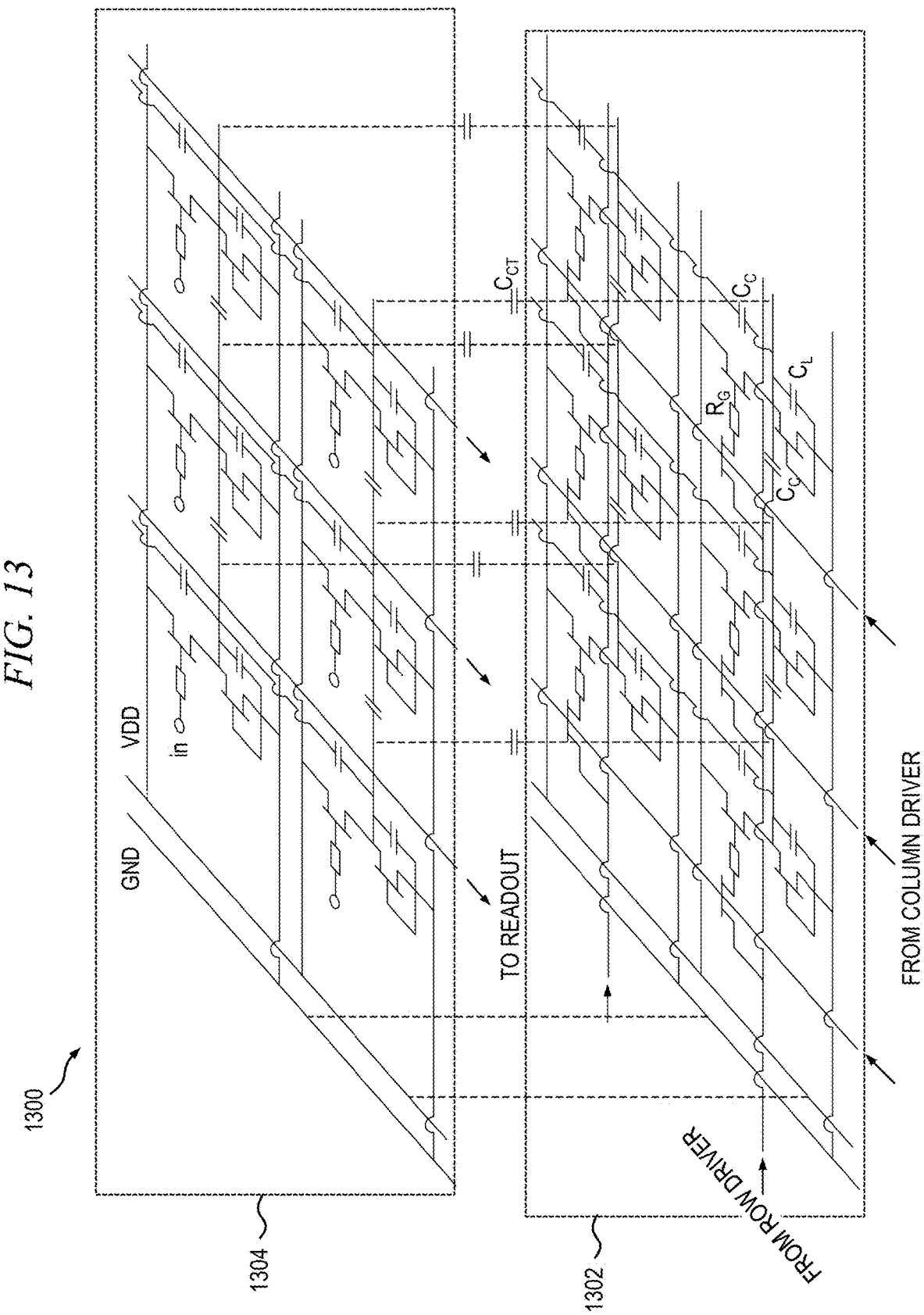
FIG. 13 is a schematic diagram depicting at least a portion of an exemplary fuzzy template matching circuit including a three-dimensional matrix of damped oscillators, according to an embodiment of the present invention.

As previously stated, a fuzzy template matching circuit may include a plurality of damped oscillators arranged not merely in the same plane, but three-dimensionally, in multiple layers of vertically stacked arrays. By way of example only and without limitation, FIG. 13 is a schematic diagram depicting at least a portion of an exemplary fuzzy template matching circuit 1300 including a three-dimensional array of damped oscillators, according to an embodiment of the invention. The use of a three-dimensional damped oscillator array can significantly improve the resolution capability of the template matching, but incurs some increase in fabrication cost due to a larger number of process steps. In particular, the additional photolithography steps increase fabrication cost for thin-film transistors.

With reference FIG. 13, the circuit 1300 includes a plurality of two-dimensional damped oscillator matrices, 1302 and 1304, arranged in a vertically stacked configuration to form a three-dimensional array of damped oscillators. Each of the damped oscillator matrices 1302, 1304, may be formed in a manner consistent with the illustrative damped oscillator matrix 1200 shown in FIG. 12, with each individual damped oscillator being coupled to adjacent damped oscillators, not merely in the same plane but also in adjacent stacked planes (e.g., above and below), using coupling capacitors, as shown in FIG. 13. Although only two, two-dimensional damped oscillator matrices 1302, 1304 are shown in this illustrative embodiment, each matrix including two rows and three columns, it is to be appreciated that embodiments of the invention are not limited to any specific number or arrangement of damped oscillator matrices.

Integration of the three-dimensional array of damped oscillators in a fuzzy template matching system would involve providing peripheral circuitry that includes column and row driver circuits (e.g., 1206 and 1208, respectively, shown in FIG. 12) for the stacked damped oscillator matrices 1302 and 1304, as will be apparent to those skilled in the art. In the exemplary circuit 1300 of FIG. 13, each damped oscillator in matrix 1304 receives an input from an input (in) line, similar to each damped oscillator (e.g. 1202) in the first set of damped oscillators in the exemplary circuit 1200 of FIG. 12, and each damped oscillator in matrix 1302 receives a reference input (supplied by the row driver) from a reference input line, similar to each damped oscillator (e.g. 1204) in the second set of damped oscillators in circuit 1200.

In this exemplary embodiment, neighboring damped oscillators within a plane (e.g. matrix 1302 which receives reference inputs, or matrix 1304 which receives inputs) are coupled to each other using coupling capacitors $C_C$ whereas neighboring damped oscillators in two different planes are coupled to each other using coupling capacitors $C_{CT}$. In the exemplary circuit 1300, the reference input lines connected to each of the damped oscillators in matrix 1302 are multiplexed using switching transistors, selectively activated by corresponding control signals supplied on the select lines by the column driver (in contrast to the exemplary circuit 1200 of FIG. 12 where the input (in) lines are multiplexed). As described with respect to FIG. 12, the input (in) lines and/or the readout lines may also be multiplexed (as an alternative, or in addition to multiplexing the reference input lines). In the exemplary circuit 1300, the outputs of the damped oscillators in matrix 1304 are connected to corresponding readout lines. However, in various embodiments, the outputs of the damped oscillators in matrix 1302 are also connected to corresponding readout lines, as described with respect to circuit 1200 of FIG. 12.

In terms of fabrication, each of at least a subset of the damped oscillators preferably includes thin-film transistors (TFTs). In one or more embodiments, the thin-film transistors are comprised of heterojunction FET (HJFET) devices with low-temperature polysilicon (LTPS) channel layers prepared by excimer laser crystallization of amorphous silicon. The gate and source/drain regions are formed by low-temperature growth of hydrogenated amorphous silicon (a-Si:H) and hydrogenated crystalline silicon (c-Si:H) at low temperatures (e.g., less than about 200 degrees Celsius). Details about an HJFET device structure and fabrication process suitable for use in conjunction with embodiments of the invention are known, for example as described in U.S. Pat. Nos. 9,093,548, 9,543,290, 9,741,871, and 9,748,281, the disclosures of which are incorporated herein by reference in their entireties for all purposes. Other HJFET device configurations (e.g., self-aligned LTPS TFTs) may also be employed, in one or more alternative embodiments.

Figure 14:
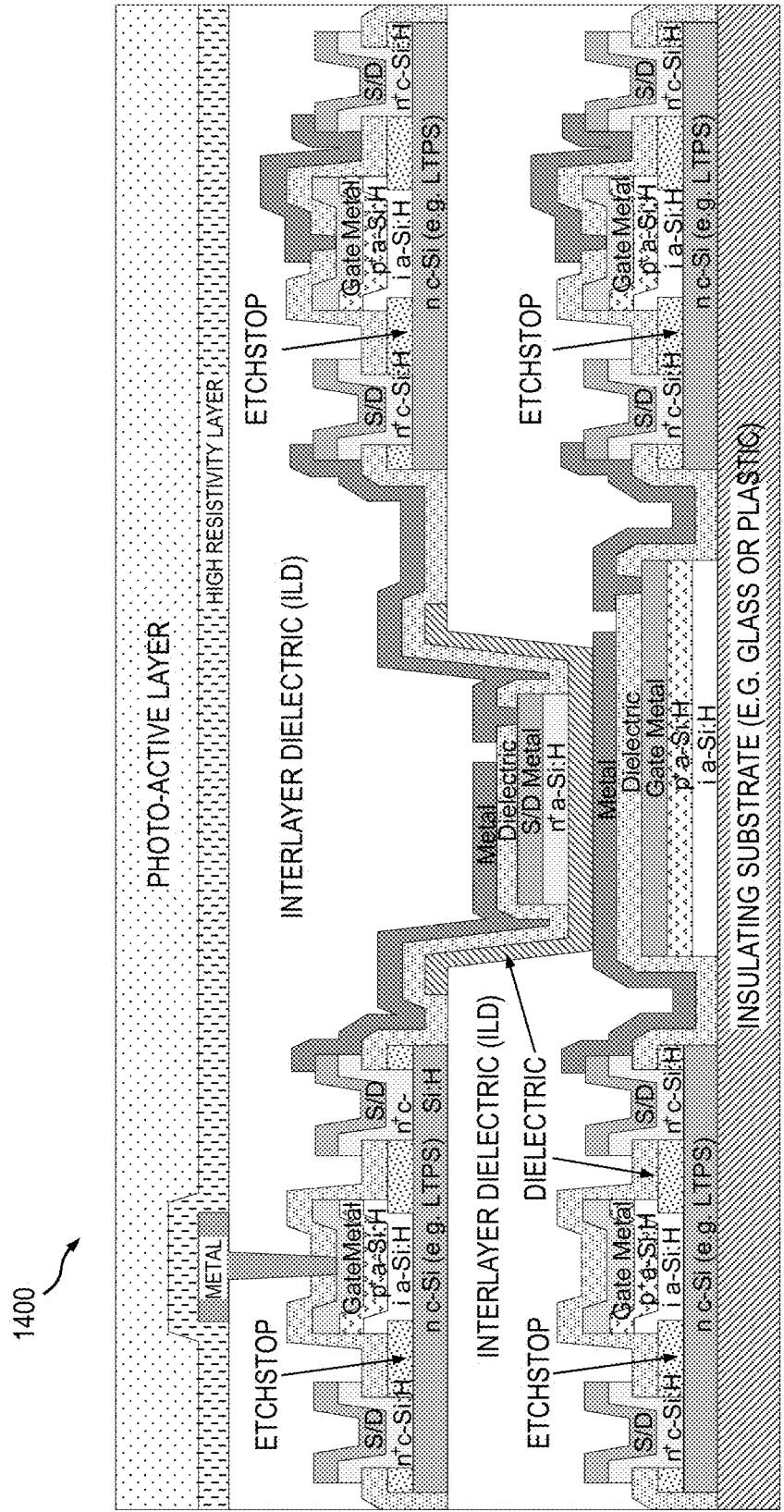
FIG. 14 is a cross-sectional view depicting an exemplary semiconductor structure including a stacked array of damped oscillators, according to an embodiment of the present invention.

In order to reduce the number of masks required in fabricating a stacked array of damped oscillators, either a gate stack or a source/drain stack in the thin-film transistor structure may also be used to form the load capacitors ($C_L$). To illustrate this beneficial concept, FIG. 14 is a cross-sectional view depicting an exemplary semiconductor structure 1400 including a stacked array of damped oscillators, according to an embodiment of the invention. The semiconductor structure 1400 includes a top left HJFET configured as a source-follower, and a top right HJFET configured as a current source, forming a damped oscillator in the top plane, and a bottom left HJFET configured as a source-follower, and a bottom right HJFET configured as a current source, forming a damped oscillator in the bottom plane. In addition a multilayer stack disposed in the middle (in between the left HJFETs and the right HJFETs) is comprised of, from top to bottom, the source/drain stack of the top HJFETs (metal/dielectric/"S/D" metal/n$^+$ a-Si:H), a dielectric layer, and the gate stack of the bottom HJFETs (metal/dielectric/gate metal/p$^+$ a-Si:H/i a-Si:H). As shown in FIG. 14, a bottom load capacitor $C_L$ is formed using the gate stack (more specifically, from the metal/dielectric/gate metal portion of the gate stack) and a top load capacitor $C_L$ is formed using the source/drain stack (more specifically, from the metal/dielectric/"S/D" metal portion of the source/drain stack), even though both could be formed using the same type of stack. Similarly, an intra-plane coupling capacitor (such as $C_C$ in circuit 1300 of FIG. 13) may be formed in the top or bottom plane using a gate stack or a source/drain stack (not explicitly shown). An inter-plane coupling capacitor $C_{CT}$, in this embodiment, is formed by the dielectric layer disposed between the gate and source/drain stacks (more specifically, from the "S/D" metal/n$^+$ a-Si:H/dielectric/metal portion of the gate stack disposed on the source/drain stack, with n$^+$ a-Si:H having a negligible contribution to $C_{CT}$).

In this embodiment, the damped oscillator formed by the top left HJFET source-follower and the top right HJFET current source is part of a matrix of damped oscillators in the top plane which receive input signals. More specifically, an input image is projected over the top surface of the semiconductor structure, which is covered by a photoactive layer, and converted to a multitude of input voltages whose values depend on the intensities of the projected image at given locations. As shown for the top left source-follower HJFET, a contact via forming a gate electrode extension conveys a corresponding input voltage to a damped oscillator in the top plane. The high resistivity layer disposed underneath the photoactive layer serves as the gate resistance ($R_G$) of the source-follower HJFET. The damped oscillator formed by the bottom left HJFET source-follower HJFET and the bottom-right current source HJFET is part of a matrix of damped oscillators in the bottom plane which receive reference input signals from the row driver (not explicitly shown). It is to be understood that the structure 1400 shown in FIG. 14 is merely illustrative, and that various details (e.g., metallization layers, selection transistors, peripheral components, etc.) have been intentionally omitted for simplicity, and dimensions not drawn to scale, as will be apparent to those skilled in the art.

Figure 15:
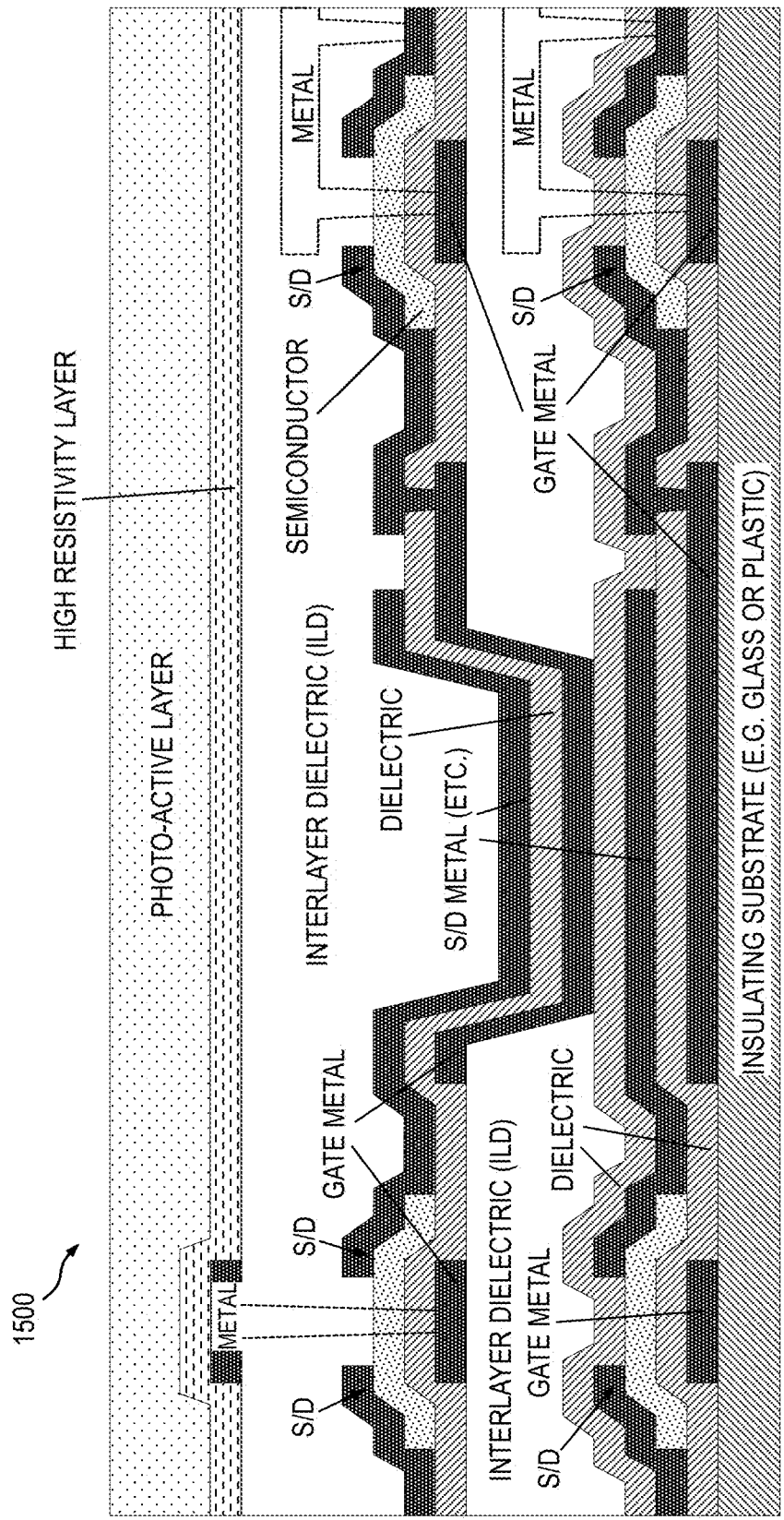
FIG. 15 is a cross-sectional view depicting an exemplary semiconductor structure including a stacked array of damped oscillators, according to an alternative embodiment of the present invention.

FIG. 15 is a cross-sectional view depicting an exemplary semiconductor structure 1500 including a stacked array of damped oscillators, according to an alternative embodiment of the invention. In this embodiment, the semiconductor structure 1500 utilizes inverted-staggered bottom-gate TFT devices. Each inverted-staggered bottom-gate TFT includes a patterned bottom-gate electrode comprised of a gate metal, a gate dielectric layer disposed on the bottom gate electrode, semiconductor active regions formed on the gate dielectric layer, and source/drain (S/D) electrodes formed on the semiconductor active regions. In this illustrative embodiment, an additional dielectric layer is disposed on the bottom TFTs and is used in forming inter-plane coupling capacitors ($C_{CT}$), as will be further described below. Examples of TFT devices suitable for use in conjunction with embodiments of the invention include, but are not limited to, a-Si:H, metal-oxide (e.g., indium gallium zinc oxide (IGZO)) and organic transistors, etc.

Similar to the exemplary structure 1400 of FIG. 14, the top-left and bottom-left TFTs are configured as source followers and the top-right and bottom-right TFTs are configured as current sources, the source-follower TFTs in the top plane are configured to receive input signals corresponding to a projected image, and the source-follower TFTs in the bottom-plane are configured to receive reference inputs corresponding to a template. In this illustrative embodiment, a load capacitor ($C_L$) in the top plane is formed by, from top to bottom, a "S/D" metal/dielectric/gate metal stack used in the fabrication of top TFTs, as shown. Similarly, a load capacitor ($C_L$) in the bottom plane is formed by, from top to bottom, a "S/D" metal/dielectric/gate metal stack used in the fabrication of bottom TFTs, as shown.

An intra-plane coupling capacitor ($C_C$) may also be formed from the same stacks (not explicitly shown). In this illustrative embodiment, a top electrode of an inter-plane coupling capacitor ($C_{CT}$) is comprised of the gate metal of the top TFTs, a dielectric layer of the $C_{CT}$ is comprised of the additional dielectric layer disposed on the bottom TFTs (as described above), and a bottom electrode of the $C_{CT}$ is formed by the S/D metal of the bottom TFTs. That is, referring to the layers in the multi-layer stack disposed in between the left (source-follower) and the right (current-source) TFTs, from top to bottom, the top S/D metal layer serves as the top electrodes of the top load capacitors ($C_L$), the underlying gate dielectric layer serves as the dielectric of the top load capacitors ($C_L$), the underlying gate metal layer serves as the bottom electrodes of the top load capacitors ($C_L$) and also the top electrodes of the inter-plane coupling capacitors ($C_{CT}$), the underlying dielectric layer serves as the dielectric of the inter-plane coupling capacitors ($C_{CT}$), the underlying S/D metal layer serves as the bottom electrodes of the inter-plane coupling capacitors ($C_{CT}$) and also the top electrodes of the bottom load capacitors ($C_L$), the underlying gate dielectric layer serves as the dielectric of the bottom load capacitors ($C_L$), and the bottom gate metal layer serves as the bottom electrodes of the bottom load capacitors ($C_L$).

As in the case of the illustrative semiconductor structure 1400 shown in FIG. 14, it is to be understood that the semiconductor structure 1500 is merely illustrative, and that various details (e.g., metallization layers, selection transistors, peripheral components, etc.) have been intentionally omitted for simplicity, and dimensions not drawn to scale, as will be apparent to those skilled in the art. For example, the source/drain (S/D) layers may comprise multiple layers (e.g., metal/n+a-Si:H in the case of a-Si:H TFT devices). The S/D contact may include interlayers or doped regions not explicitly shown. Contact vias not in the plane of the drawing are depicted as dashed lines. Furthermore, dimensions are not drawn to scale.

As in the case of the structure 1400 shown in FIG. 14, the structure 1500 includes a photo-active layer that may be comprised of any known photo-active material and may include a single layer or multiple layers. Examples of photo-active materials suitable for use with embodiments of the invention include, but are not limited to, chalcogenides, organic compounds, inorganic semiconductors, etc. In some embodiments, a single or multi-layer stack of one or more p-n or p-i-n junctions (e.g., comprised of hydrogenated a-Si:H formed by plasma-enhanced chemical vapor deposition (PECVD)) is used as a photo-active layer. In one or more embodiments, an organic photo-active layer (e.g., P3HT:PCBM, etc. formed by spin-coating) is used. In still other embodiments, an inorganic compound semiconductor (e.g., GaAs or InAs-based p-n junction layer) grown separately is transferred (e.g., using spalling or epitaxial lift-off) and laminated onto the structure.

Figure 16:
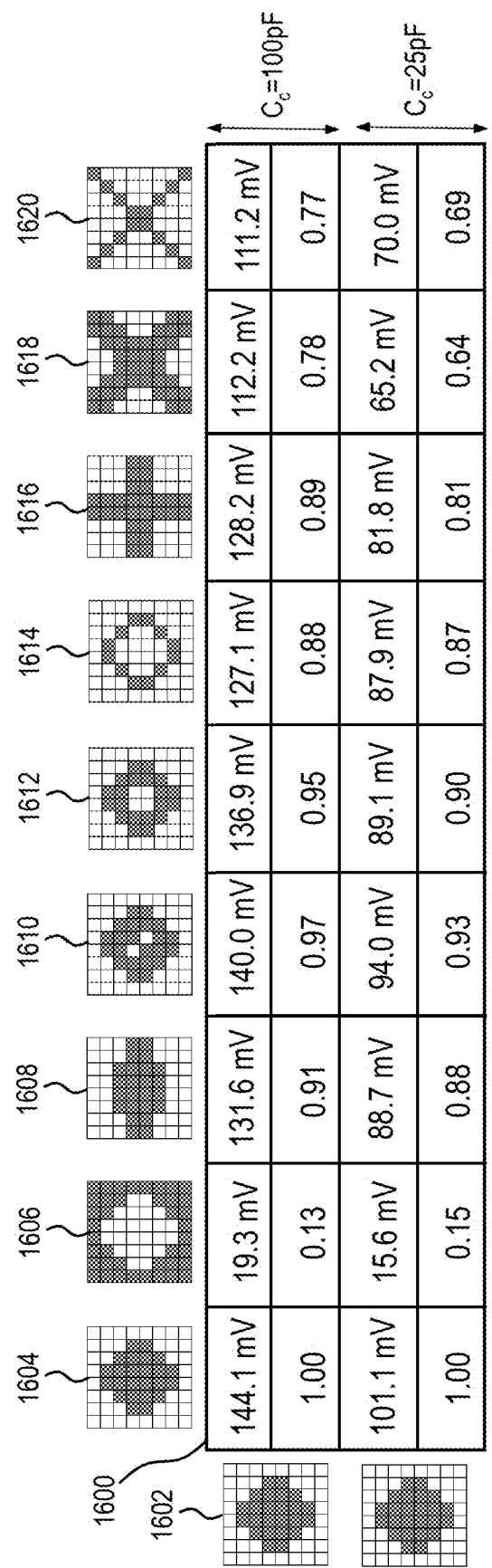
FIG. 16 conceptually depicts a table including simulated raw and normalized matching scores for an example reference pattern and various input templates for two different coupling capacitor values, according to an embodiment of the present invention.

By way of example only and without loss of generality, an illustrative template matching simulation using the damped oscillator matrix according to embodiments of the invention will now be described. Simulation was performed on an exemplary circuit comprised of an array of damped oscillators configured as source followers according to FIG. 3A. The simulated circuit corresponds to the circuit 1300 of FIG. 13 with a 16×16 damped oscillator matrix for each of the top and bottom planes (or equivalently, the circuit 1200 of FIG. 12 with a 32×32 damped oscillator matrix) with inter-plane coupling capacitors $C_{CT}$ omitted in this simulation example. FIG. 16 conceptually depicts a table 1600 including raw (first and third rows) and normalized (second and fourth rows) matching scores for an example reference pattern (template) 1602 and various input patterns, 1604 through 1620, for two different intra-plane coupling capacitor ($C_C$) values. In this simulation example, a "matching score" between a reference pattern and an input pattern is chosen to be the average root-mean-square (RMS) of a sum of corresponding damped oscillator output voltages (i.e., pixel voltages), after removing any DC component from the sum and after filtering out high-frequency components. The matching scores presented in the table 1600 are for coupling capacitor values of 100 pF (top two rows) and 25 pF (bottom two rows). Furthermore, it is assumed, for this example, that the white and gray pixels in the input pattern correspond to input signals of 500 mV and 100 mV, respectively. In the context of the semiconductor structures 1400 and 1500 of FIGS. 14 and 15, the white and gray pixels correspond to the high and low brightness spots of an input image projected over the photo-active layer. In this example, it is also assumed that white and gray pixels in the reference pattern correspond to input reference voltages of 500 mV and 100 mV, respectively.

With reference to table 1600, assuming a coupling capacitor $C_C$ of 100 pF, a maximum voltage, 144.1 mV, is generated when comparing the reference (template) pattern 1602 with the input pattern 1604, which are essentially identical to one another. This maximum voltage correlates to normalized matching score of 1.00. The input pattern 1610 is very close to the reference pattern 1602 and therefore the normalized matching score for this case, 140 mV/144.1 mV=0.97, is very close to the maximum normalized score of 1.00 where an identical match was found. A minimum voltage, 19.3 mV, is generated when comparing the reference pattern 1602 with the input pattern 1606, which are essentially inverses of one another. The normalized matching score for this case is 19.3 mV/144.1 mV=0.13, in this example. A higher matching score is indicative of a closer match between the template and the reference pattern, and vice versa.

The chosen matching score is a measure of how similar the collective response of the coupled damped oscillators receiving the input signals is to the collective response of the coupled damped oscillators receiving the reference (template) signals. This contrasts with a matching score that disregards the collective response corresponding to the association of the pixels with each other within a pattern, such as how many pixels in the input pattern match corresponding pixels in the reference (template) pattern. The resulting fuzziness in template matching is a direct consequence of coupling between damped oscillators.

A similar trend in matching scores is found when a coupling capacitor $C_C$ of 25 pF is used. For example, when comparing the reference pattern 1602 with an identical input template 1604, a maximum voltage of 101.1 mV is generated. This correlates to a normalized matching score of 1.00, consistent with the case when using a coupling capacitor of 100 pF. Likewise, when comparing the reference pattern 1602 with input template 1606, which is an inverse of the reference pattern, a minimum voltage of 15.6 mV is generated, corresponding to a normalized matching score of 0.15. A higher matching score is indicative of a closer match between the input template and the reference pattern, and vice versa. Lowering the coupling capacitance ($C_C$) reduces the fuzziness of template matching, as expected.

The apparent exception in the second column (the input pattern 1606 having a higher normalized matching score of 0.15 for $C_C$=25 pF compared to 0.13 for $C_C$=100 pF), is due to the non-ideality of the low-pass (RC) filters used to remove the high-frequency components in the damped oscillator output voltages which limits the accuracy of very low output voltages (i.e., of very dissimilar patterns). Furthermore, it is to be understood that the above definition of the matching score is a non-limiting example, and that various other definitions are contemplated according to embodiments of the invention, as will become apparent to those skilled in the art given the teachings herein.

FIG. 17 conceptually depicts a table 1700 including simulated raw and normalized matching scores for example reference patterns, 1702 through 1718, compared with the various illustrative input patterns, 1604 through 1620, shown in FIG. 16, according to an embodiment of the invention. Table 1700 is essentially an expansion of table 1600 shown in FIG. 16 for various reference patterns 1702 through 1718. The illustrative raw and normalized matching scores are obtained assuming a coupling capacitance ($C_C$) of 100 pF.

The gray shaded entries along a diagonal in table 1700 present raw damped oscillator output voltages and normalized matching values set equal to 1.00, which are representative of a match between each reference pattern and an identical input pattern.

Figure 18:
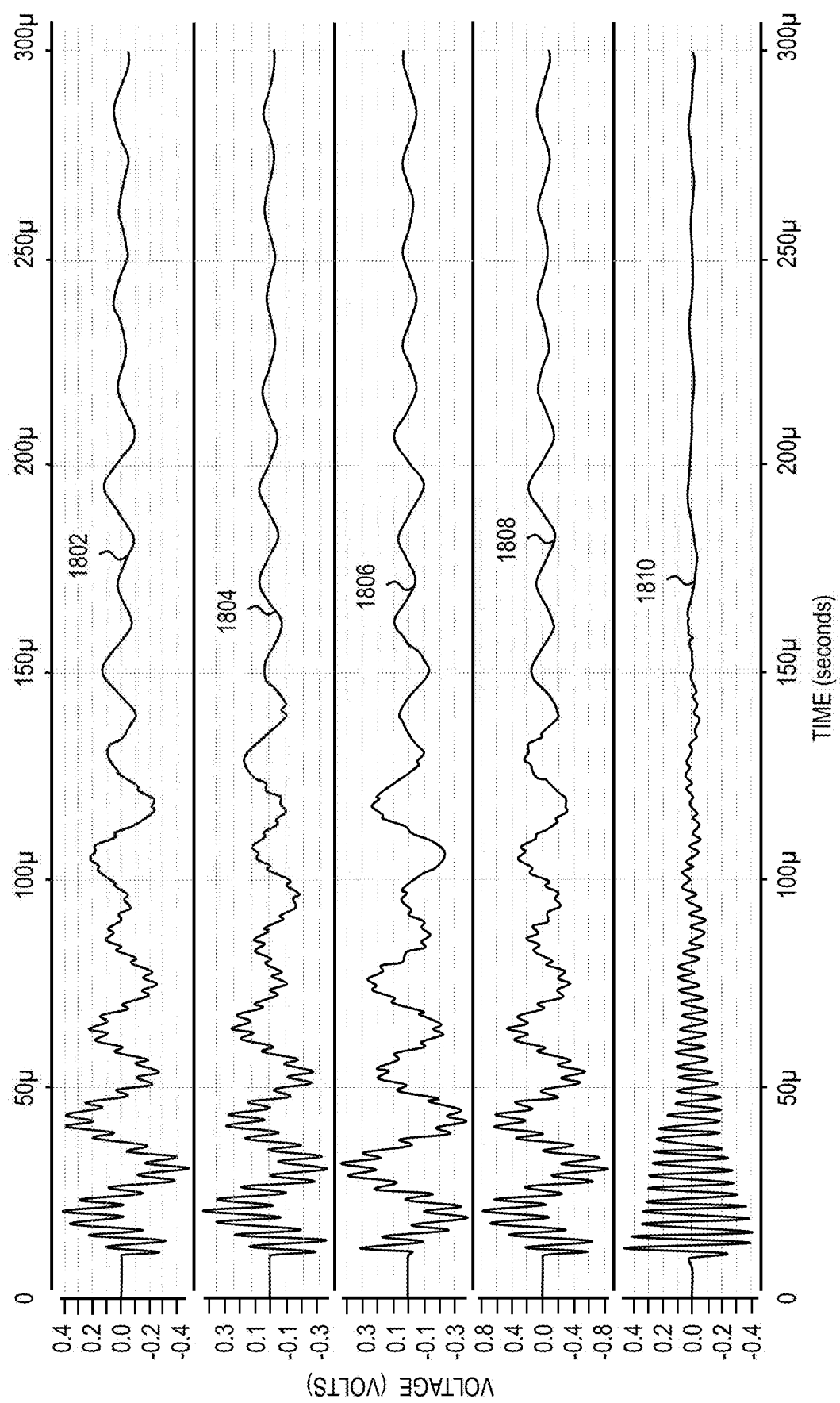
FIG. 18 is a graph depicting exemplary damped oscillator output voltage waveforms, according to an embodiment of the present invention.

FIG. 18 is a graph depicting exemplary damped oscillator output voltage waveforms, 1802 through 1810, according to an embodiment of the invention. These damped oscillator output voltage waveforms conceptually illustrate the interaction of three damped oscillators. Specifically, with reference to FIG. 18, waveforms 1802, 1804 and 1806 represent damped oscillator output voltages corresponding to first, second and third damped oscillators, respectively; the first and second damped oscillators are in-phase with one another and out-of-phase with the third damped oscillator. Waveform 1808 represents a combination of the first and second damped oscillator output voltages, and waveform 1810 represents a combination of the first and third damped oscillator output voltages. Waveform 1808 shows an additive response of combining two in-phase damped oscillators, while waveform 1810 shows a subtractive response of combining two out-of-phase damped oscillators. In this simulation example, waveform 1808 is simply the algebraic sum of waveforms 1802 and 1804, and similarly waveform 1810 is simply the algebraic sum of waveforms 1802 and 1806. That is, at any given time, a voltage on waveform 1808 is the algebraic sum of the voltages on waveforms 1802 and 1804 at that given time, and similarly, at any given time, a voltage on waveform 1810 is the algebraic sum of the voltages on waveforms 1802 and 1806 at that given time. As will be known by those skilled in the art, an algebraic sum of in-phase signals has an additive effect, whereas an algebraic sum of out-of-phase signals has a subtractive effect.

Figure 19:
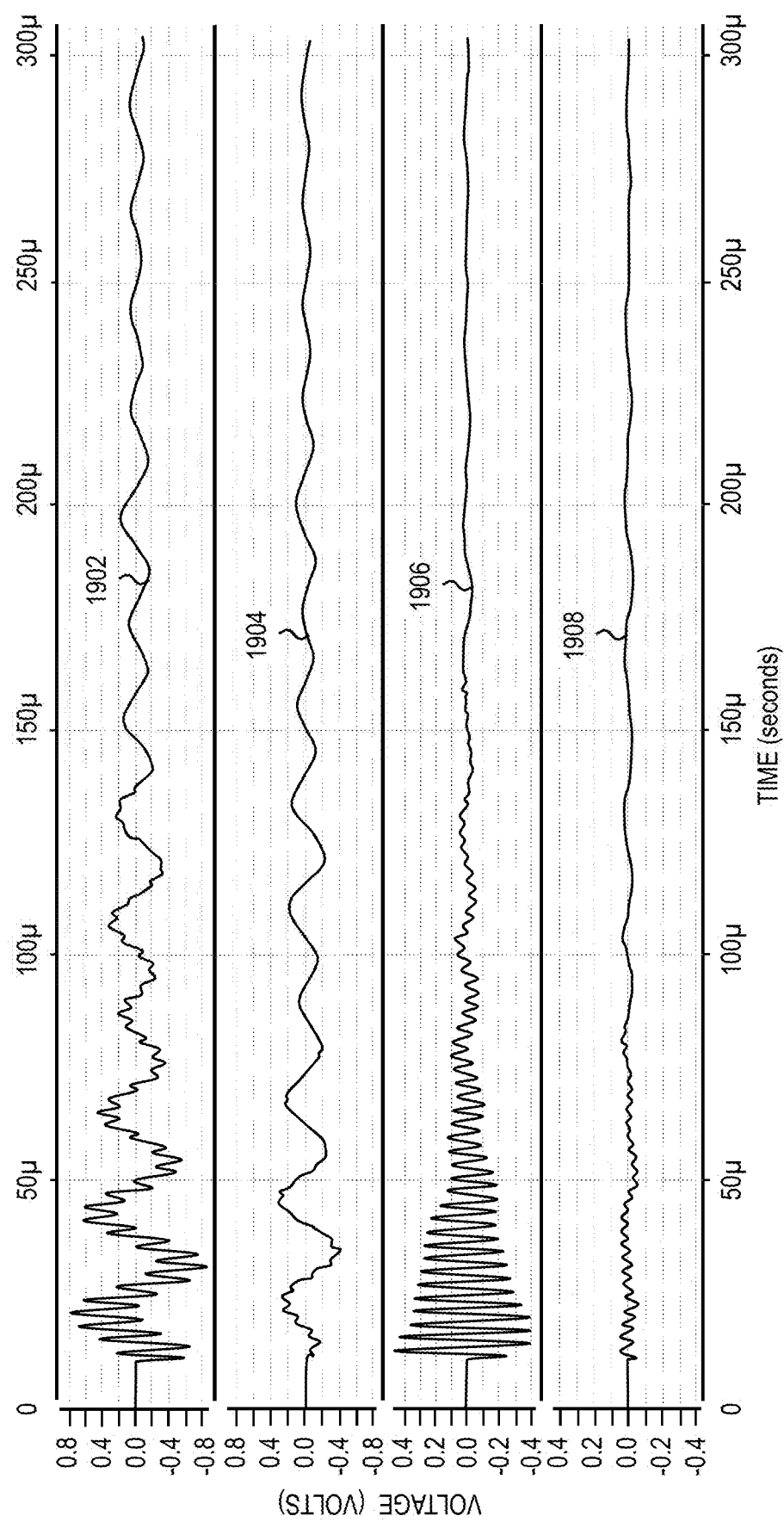
FIG. 19 is a graph depicting the exemplary combined damped oscillator output signal waveforms shown in FIG. 18 with and without filtering, according to an embodiment of the present invention.

Optionally, in order to allow comparison of the first and second and first and third damped oscillator outputs at shorter time scales and/or to increase a detection margin and accuracy of the comparison, high-frequency components of the respective combined signals can be filtered out, for example using a low-pass (e.g., RC) filter, as will be known by those skilled in the art. FIG. 19 is a graph depicting the exemplary combined damped oscillator output signal waveforms 1808 and 1810 shown in FIG. 18, with and without filtering, according to an embodiment of the invention. Specifically, waveform 1902, which is a re-plot of waveform 1808, represents the combination of two in-phase damped oscillator outputs without filtering, and waveform 1904 represents the combination of the two in-phase damped oscillator outputs with low-pass filtering, waveform 1906, which is a re-plot of waveform 1810, represents the combination of two out-of-phase damped oscillator outputs without filtering, and waveform 1908 represents the combination of the two out-of-phase damped oscillator outputs with low-pass filtering. In this example, waveform 1904 is the result of applying a low-pass filter directly on waveform 1902, and waveform 1908 is the result of applying a low-pass filter directly on waveform 1906. For this example, a low-pass filter having an RC delay of 4 µs was used and the average RMS of the signals calculated from 20 µs to 100 µs was used for comparison. It is to be appreciated that this range is arbitrary and that other ranges could similarly be used, as will become apparent to those skilled in the art given the teachings herein. Furthermore, other parameters, such as, for example, maximum peak (e.g., using a peak detector circuit), average of the clamped signal (e.g., using a clamper circuit and an integrator), etc., can also be employed for comparison.

At least a portion of the circuits, structures and methods described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary circuits and/or structures discussed above can be distributed in raw form (i.e., a single wafer having multiple unpackaged chips), as bare dies, in packaged form, or incorporated as parts of intermediate products or end products that may benefit from having template matching circuitry formed in accordance with one or more of the exemplary embodiments.

The illustrations of embodiments described herein are intended to provide a general understanding of the various embodiments, and they are not intended to serve as a complete description of all the elements and/or features of apparatus, methods and systems that might make use of the circuits, structures and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of exemplary methods described herein may occur out of the order described or noted in the figures (where shown). For example, two steps described or shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Reference made throughout this specification to "one embodiment" or "an embodiment" is intended to mean that a particular feature, structure, or characteristic described in connection with the embodiment is included in at least one embodiment of the claimed subject matter. It is to be understood that appearances of the phrase "in one embodiment" or "an embodiment" are not necessarily all referring to the same embodiment. Furthermore, embodiments may be referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it is to be appreciated that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below," where used, are intended to indicate positioning of elements or structures relative to each other as opposed to absolute elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus, the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. An apparatus for performing fuzzy template matching, the apparatus comprising:
   a plurality of damped oscillators arranged in at least one two-dimensional matrix, each of the damped oscillators being capacitively coupled to at least one adjacent damped oscillator in the matrix; and
   peripheral circuitry coupled with the plurality of damped oscillators, the peripheral circuitry being configured to selectively interface with the plurality of damped oscillators, as a function of one or more control signals supplied to the peripheral circuitry, and to generate at least one output signal indicative of an accuracy of matching between a template pattern and an input pattern,
   wherein the peripheral circuitry comprises:
   a column driver circuit, the column driver circuit being connected with one or more readout lines, each of the readout lines being coupled with respective output nodes of a first subset of damped oscillators in a corresponding column of the matrix of damped oscillators, and being connected to one or more select lines, each of the select lines being configured for selectively enabling individual damped oscillators in the first subset of damped oscillators; and
   a row driver circuit, the row driver circuit being connected with one or more reference input lines, each of the reference input lines being coupled with respective input nodes of a second subset of damped oscillators in a corresponding row of the matrix of damped oscillators, the input reference lines being adapted to convey signals indicative of a reference template to which an input pattern is being matched.

2. The apparatus of claim 1, wherein each of at least a subset of the plurality of damped oscillators comprises:
   a first transistor connected in a source follower configuration;
   a second transistor coupled with the first transistor and configured as a current source;
   a resistor coupled with an input of the first transistor; and a capacitor coupled in parallel with the second transistor.

3. The apparatus of claim 2, wherein the first transistor comprises a thin-film heterojunction field-effect transistor (HJFET) having a drain connected with a first supply voltage source, a source connected with the second transistor, and a gate connected with the resistor and adapted to receive an input signal supplied to the damped oscillator.

4. The apparatus of claim 1, wherein first and second adjacent damped oscillators in the matrix of damped oscillators are coupled together via a coupling capacitor, a first terminal of the coupling capacitor being connected with an output of the first damped oscillator and a second terminal of the coupling capacitor being connected with an output of the second damped oscillator.

5. The apparatus of claim 1, further comprising at least first and second two-dimensional matrices of damped oscillators, the second matrix being stacked vertically over the first matrix, wherein each of at least a subset of the damped oscillators in the first matrix is capacitively coupled with at least one adjacent damped oscillator in the second matrix.

6. The apparatus of claim 5, wherein the peripheral circuitry is coupled with the second matrix and configured to selectively interface with the plurality of damped oscillators in the second matrix as a function of the one or more control signals.

7. The apparatus of claim 5, wherein the peripheral circuitry is coupled with the first matrix and is configured to selectively interface with the plurality of damped oscillators in the first matrix as a function of one or more readout signals.

8. The apparatus of claim 1, further comprising at least one filter circuit, the filter circuit being configured to remove high-frequency components in an output signal generated by each of at least a subset of the plurality of damped oscillators.

9. The apparatus of claim 1, wherein the peripheral circuit further comprises at least one of:
   a first plurality of switching transistors coupled with at least a subset of the readout lines and configured to multiplex the subset of readout lines as a function of at least a first control signal supplied to the column driver circuit; and
   a second plurality of switching transistors coupled with at least a subset of input lines for each of the damped oscillators and configured to multiplex the input lines as a function of at least a second control signals supplied to the matrix of damped oscillators.

10. The apparatus of claim 1, wherein the peripheral circuit further comprises at least one of:
    a first plurality of switching transistors coupled with at least a subset of the readout lines and configured to multiplex the subset of the readout lines as a function of at least a first control signal supplied to the column driver circuit; and
    a second plurality of switching transistors coupled with at least a subset of reference input lines for each of the damped oscillators and configured to multiplex the reference input lines as a function of at least a second control signals supplied to the matrix of damped oscillators.

11. An apparatus for performing fuzzy template matching, the apparatus comprising:
    a plurality of damped oscillators arranged in at least one two-dimensional matrix, each of the damped oscillators being capacitively coupled to at least one adjacent damped oscillator in the matrix;
    peripheral circuitry coupled with the plurality of damped oscillators, the peripheral circuitry being configured to selectively interface with the plurality of damped oscillators, as a function of one or more control signals supplied to the peripheral circuitry, and to generate at least one output signal indicative of an accuracy of matching between a template pattern and an input pattern;
    at least first and second two-dimensional matrices of damped oscillators, wherein each of at least a subset of the damped oscillators in the second matrix receives an input signal associated with an input pattern; and a photoactive layer disposed over the second matrix, wherein an input pattern projected over the photoactive layer is converted to a plurality of input voltages applied to the damped oscillators.

12. The apparatus of claim 11, the second matrix being stacked vertically over the first matrix, wherein each of at least a subset of the damped oscillators in the first matrix receives a reference input signal associated with a template pattern.

13. A method for performing fuzzy template matching, the method comprising:

obtaining a fuzzy template matching circuit including a plurality of damped oscillators arranged in at least one two-dimensional matrix, each of the damped oscillators being capacitively coupled to at least one adjacent damped oscillator in the matrix, and peripheral circuitry coupled with the plurality of damped oscillators;

supplying an input pattern to the fuzzy template matching circuit for comparison with a reference template pattern;

supplying one or more control signals to the peripheral circuitry to selectively interface with the plurality of damped oscillators; and generating, by the template matching circuit, at least one output signal indicative of an accuracy of matching between the template pattern and the input pattern, wherein the fuzzy template matching circuit further includes at least first and second two-dimensional matrices of damped oscillators, the second matrix being stacked vertically over the first matrix, the method further comprising:

supplying a reference input signal associated with a template pattern to each of at least a subset of the damped oscillators in the first matrix; and supplying an input signal associated with an input pattern to each of at least a subset of the damped oscillators in the second matrix; and forming a photoactive layer over the second matrix, wherein an input pattern projected over the photoactive layer is converted to a plurality of input voltages applied to the damped oscillators.

14. The method of claim 13, wherein the fuzzy template matching circuit further comprises at least first and second two-dimensional matrices of damped oscillators, the method further comprising vertically stacking the second matrix over the first matrix, wherein each of at least a subset of the damped oscillators in the first matrix is capacitively coupled with at least one adjacent damped oscillator in the second matrix.

15. The method of claim 14, further comprising coupling the peripheral circuitry with the second matrix, and configuring the peripheral circuitry to selectively interface with the plurality of damped oscillators in the second matrix as a function of the one or more control signals.

16. The method of claim 14, further comprising coupling the peripheral circuitry with the first matrix, and configuring the peripheral circuitry to selectively interface with the plurality of damped oscillators in the first matrix as a function of one or more readout signals.

17. The method of claim 13, further comprising removing high-frequency components in an output signal generated by each of at least a subset of the plurality of damped oscillators in the fuzzy template matching circuit.

18. The method of claim 13, further comprising:

supplying a reference input signal associated with a template pattern to each of at least a subset of the damped oscillators in the first matrix.

* * * * *